(12) United States Patent
Cho et al.

(10) Patent No.: US 11,416,335 B2
(45) Date of Patent: Aug. 16, 2022

(54) SEMICONDUCTOR MEMORY DEVICES AND MEMORY SYSTEMS WITH ENHANCED ERROR DETECTION AND CORRECTION

(71) Applicant: Samsung Electronics Co., Ltd., Suwon-si (KR)

(72) Inventors: Sunghye Cho, Hwaseong-si (KR); Chanki Kim, Ansan-si (KR); Kijun Lee, Seoul (KR); Sanguhn Cha, Suwon-si (KR); Myungkyu Lee, Seoul (KR)

(73) Assignee: Samsung Electronics Co., Ltd.

( * ) Notice: Subject to any disclaimer, the term of this patent is extended or adjusted under 35 U.S.C. 154(b) by 144 days.

(21) Appl. No.: 16/934,677

(22) Filed: Jul. 21, 2020

(65) Prior Publication Data

US 2021/0191810 A1 Jun. 24, 2021

(30) Foreign Application Priority Data

Dec. 18, 2019 (KR) .................... 10-2019-0170024

(51) Int. Cl.
| | |
|---|---|
| *G06F 11/10* | (2006.01) |
| *H03M 13/00* | (2006.01) |
| *H01L 25/065* | (2006.01) |
| *H01L 25/18* | (2006.01) |

(52) U.S. Cl.
CPC ...... *G06F 11/1068* (2013.01); *H01L 25/0657* (2013.01); *H01L 25/18* (2013.01); *H03M 13/616* (2013.01); *H01L 2225/06513* (2013.01); *H01L 2225/06541* (2013.01)

(58) Field of Classification Search
CPC .. G06F 11/1068; H01L 25/0657; H01L 25/18; H01L 2225/06513; H01L 2225/06541; H03M 13/616
See application file for complete search history.

(56) References Cited

U.S. PATENT DOCUMENTS

| | | |
|---|---|---|
| 5,313,425 A | 5/1994 | Lee et al. |
| 7,779,334 B2 | 8/2010 | Earle et al. |
| 8,560,927 B1 | 10/2013 | Pagiamtzis et al. |
| 8,812,942 B2 | 8/2014 | Kim et al. |
| 9,195,551 B2 | 11/2015 | Das et al. |
| 2017/0109231 A1* | 4/2017 | Cha ................ G06F 11/1048 |
| 2017/0255512 A1* | 9/2017 | Zamir ................ H03M 13/618 |
| 2018/0246783 A1* | 8/2018 | Avraham ............... G11C 29/52 |
| 2018/0358060 A1 | 12/2018 | Cha et al. |
| 2019/0250985 A1 | 8/2019 | Seo et al. |

* cited by examiner

*Primary Examiner* — Kyle Vallecillo
(74) *Attorney, Agent, or Firm* — Myers Bigel, P.A.

(57) ABSTRACT

A semiconductor memory device includes a memory cell array, an error correction circuit, an input/output (I/O) gating circuit and a control logic circuit. The memory cell array is coupled to word-line and bit-lines and is divided into sub array blocks. The error correction circuit generates parity data based on main data using an error correction code (ECC). The control logic circuit controls the error correction circuit and the I/O gating circuit based on a command and address. The control logic circuit stores the main data and the parity data in (k+1) target sub array blocks in the second direction among the sub array blocks, and controls the I/O gating circuit such that a portion of the (k+1) target sub array blocks store both of a portion of the main data and a portion of the parity data.

20 Claims, 25 Drawing Sheets

```
            d0  p0  d1  d2  p1  p2  d3  d4  p3  d5
          ⎡  1   1   1   0   0   0   0   0   1   1  ⎤
ECC11a ⎯⎯  │  1   0   0   1   1   0   0   1   1   0  │
          │  0   0   1   1   0   1   1   0   1   1  │
          ⎣  0   0   0   0   0   0   1   1   1   1  ⎦
             ↑   ↑   ↑   ↑   ↑   ↑   ↑   ↑   ↑   ↑
            CV0 CV1 CV2 CV3 CV4 CV5 CV6 CV7 CV8 CV9
```

US 11,416,335 B2

SEMICONDUCTOR MEMORY DEVICES AND MEMORY SYSTEMS WITH ENHANCED ERROR DETECTION AND CORRECTION

REFERENCE TO PRIORITY APPLICATION

This application claims priority under 35 U.S.C. § 119 to Korean Patent Application No. 10-2019-0170024, filed Dec. 18, 2019, the disclosure of which is hereby incorporated herein by reference.

TECHNICAL FIELD

Example embodiments of the present disclosure relate to memory devices, and more particularly, to semiconductor memory devices and memory systems including the same.

BACKGROUND

Semiconductor memory devices may be classified as non-volatile memory devices, such as flash memory devices, and volatile memory devices, such as dynamic random access memory (DRAM) devices. DRAM devices are often used for system memories due to their high speed operation and high cost efficiency. Due to the continuing reduction in fabrication design rules of DRAM devices, bit errors of memory cells in DRAM devices can increase, and cause a deterioration in DRAM functionality, reliability and yield.

SUMMARY

Example embodiments of the present disclosure provide a semiconductor memory device and memory system capable of enhanced performance and greater reliability.

According to some example embodiments, a semiconductor memory device includes a memory cell array, an error correction circuit, a control logic circuit, and an input/output (I/O) gating circuit connected between the memory cell array and the error correction circuit. The memory cell array includes a plurality of volatile memory cells coupled to word-line and bit-lines. The memory cell array is divided into a plurality of sub array blocks arranged in a first direction and a second direction crossing the first direction. The error correction circuit generates parity data based on main data using an error correction code (ECC) represented by a generation matrix. The control logic circuit controls the error correction circuit and the I/O gating circuit based on a command and address from an external memory controller. The control logic circuit stores the main data and the parity data in (k+1) target sub array blocks in the second direction among the sub array blocks. The control logic circuit controls the I/O gating circuit such that a portion of the (k+1) target sub array blocks store both a portion of the main data and a portion of the parity data. Here, k is an even integer greater than two (2).

According to some example embodiments, a semiconductor memory device includes a memory cell array, an error correction circuit, a control logic circuit, and an input/output (I/O) gating circuit connected between the memory cell array and the error correction circuit. The memory cell array includes a plurality of bank arrays and each of the plurality of bank arrays includes a plurality of volatile memory cells connected to a plurality of word-lines and a plurality of bit-lines. The error correction circuit is configured to generate parity data based on the main data using an error correction code (ECC) represented by a generation matrix. The control logic circuit controls the error correction circuit based on a command and an address from an external memory controller. The error correction circuit: (i) stores the main data and the parity data in a target area within a target page in a memory cell array, designated by the address, (ii) interleaves the main data and the parity data such that parity bits of the parity data are stored symmetrically with respect to a virtual center line in the target area, and (iii) varies sub data patterns based on a least significant bit (LSB) of the address designating the target page. The main data and the parity data stored in the target area constitute the sub data patterns.

According to additional embodiments, a memory system includes a semiconductor memory device and a memory controller to control the semiconductor memory device. The semiconductor memory device includes a memory cell array, a first error correction circuit, a control logic circuit, and an input/output (I/O) gating circuit connected between the memory cell array and the error correction circuit. The memory cell array, which includes a plurality of volatile memory cells coupled to word-lines and bit-lines, is divided into a plurality of sub array blocks arranged in a first direction and a second direction crossing the first direction. The first error correction circuit generates parity data based on main data using a first error correction code (ECC) represented by a generation matrix. The control logic circuit controls the error correction circuit and the I/O gating circuit based on a command and address from the memory controller. The control logic circuit stores the main data and the parity data in (k+1) target sub array blocks in the second direction among the sub array blocks, and controls the I/O gating circuit such that a portion of the (k+1) target sub array blocks store both a portion of the main data and a portion of the parity data. Here, k is an even integer greater than two.

According to further embodiments, the first error correction circuit included in the semiconductor memory device includes a first ECC and the first ECC includes column vectors have elements to restrict a location of a sub data unit in which a mis-corrected bit generated by multiple error bits occurs in a specific symbol. The memory controller includes a second error correction circuit including a second ECC. The second ECC may correct error bits in the specific symbol and may correct the multiple error bits and the mis-corrected bit. Therefore, the memory controller may prevent system failure caused by the multiple error bits and the mis-corrected bit.

BRIEF DESCRIPTION OF THE DRAWINGS

The above and other features of the present disclosure will become more apparent by describing in detail example embodiments thereof with reference to the accompanying drawings.

DETAILED DESCRIPTION OF THE EMBODIMENTS

Figure 1:
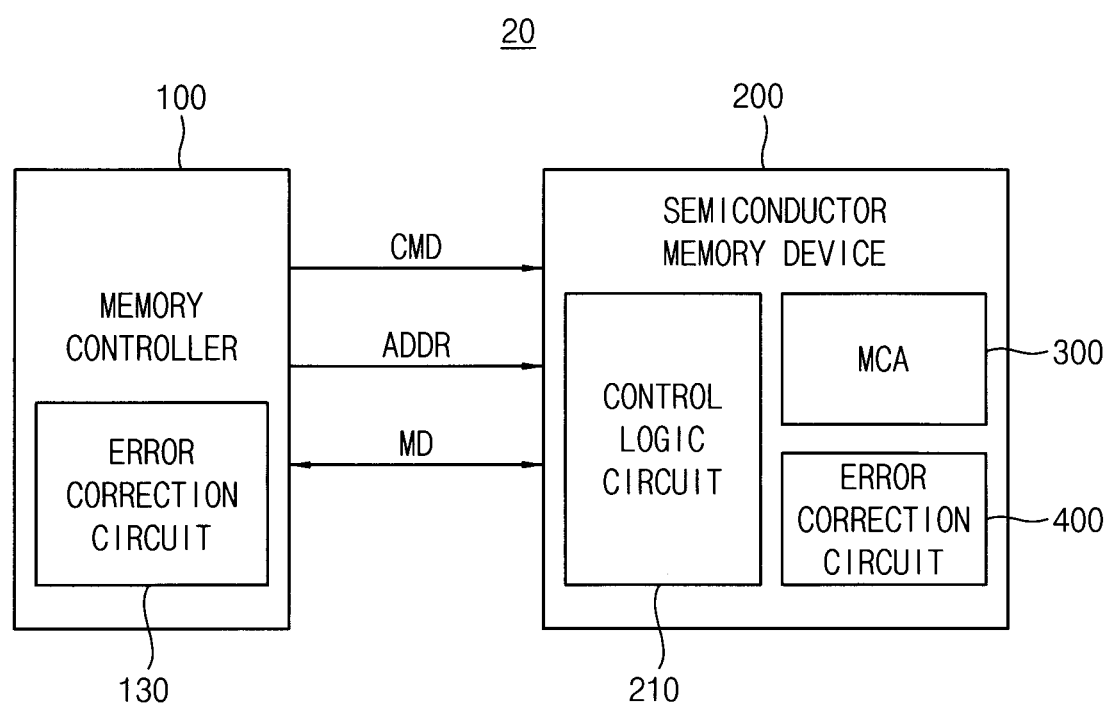
FIG. 1 is a block diagram illustrating a memory system according to example embodiments of the present disclosure.

Example embodiments of the present disclosure will be described more fully hereinafter with reference to the accompanying drawings. Like reference numerals may refer to like elements throughout the accompanying drawings.

FIG. 1 is a block diagram illustrating a memory system according to example embodiments of the present disclosure. Referring to FIG. 1, a memory system 20 may include a memory controller 100 (e.g., an external memory controller) and a semiconductor memory device 200. The memory controller 100 may control the overall operation of the memory system 20. The memory controller 100 may control the overall data exchange between an external host and the semiconductor memory device 200. For example, the memory controller 100 may write data in the semiconductor memory device 200 or read data from the semiconductor memory device 200 in response to request from the host. In addition, the memory controller 100 may issue operation commands to the semiconductor memory device 200 for controlling the semiconductor memory device 200.

In example embodiments, the semiconductor memory device 200 is a memory device including a plurality of dynamic (volatile) memory cells such as a dynamic random access memory (DRAM), double data rate 5 (DDR5) synchronous DRAM (SDRAM), DDR6 SDRAM or a stacked memory device such as a high bandwidth memory (HBM). In addition, the memory controller 100 may transmit a clock signal CLK, a command CMD, and an address (signal) ADDR to the semiconductor memory device 200 and exchange main data MD with the semiconductor memory device 200.

As shown in FIG. 1, the memory controller 100 may include an error correction circuit 130. The error correction circuit 130 may generate parity data based on the main data MD to be transmitted to the semiconductor memory device 200, may store the parity data, may generate check bits based on the main data MD received from the semiconductor memory device 200 and may correct error bits in the main data MD by symbol basis based on a comparison of the system parity data and the check bits.

The semiconductor memory device 200 includes a memory cell array 300 that stores the main data MD, an error correction circuit 400 and a control logic circuit 210. The error correction circuit 400 may be referred to a first error correction circuit. The memory cell array 300 may be divided into plurality of sub array blocks arranged in a first direction and a second direction crossing the first direction.

The error correction circuit 400 may generate parity data using an error correction code (ECC) which is represented by a generation matrix by performing an ECC encoding on the main data MD and may detect and/or correct at least one error bit in the main data MD read from the memory cell array 300 using the parity data by performing an ECC decoding on the main data MD.

The control logic circuit 210 may control the error correction circuit 400 to store the main data MD and the parity data in (k+1) target sub array blocks in the second direction among the sub array blocks such that a portion of the (k+1) target sub array blocks store both a portion of the main data and a portion of the parity data. Here, k is an even integer greater than two.

The main data MD includes a plurality of data bits, and the plurality of data bits may be divided into a plurality of sub data units. The ECC may include a plurality of column vectors divided into a plurality of code groups corresponding to the sub data units and the parity data and the column vectors may have elements to restrict a location of a sub data unit in which a mis-corrected bit occurs, generated by multiple error bits of the main data MD and the multiple error bits are uncorrectable by using the ECC by the error correction circuit 400. If data read from the memory cell array 300 includes the multiple error bits which are undetectable and/or uncorrectable by using the error correction circuit 400, the error correction circuit 130 may correct error bits in the sub data unit including the multiple error bits.

The semiconductor memory device 200 may perform a burst operation. Herein, the burst operation refers to an operation of writing or reading a large amount of data by sequentially increasing or decreasing an initial address provided from the memory controller 100. A basic unit of the burst operation may be referred to as a burst length BL. In example embodiments, the burst length BL refers to the number of operations of continuously reading or writing data by sequentially increasing or decreasing an initial address.

Figure 2:
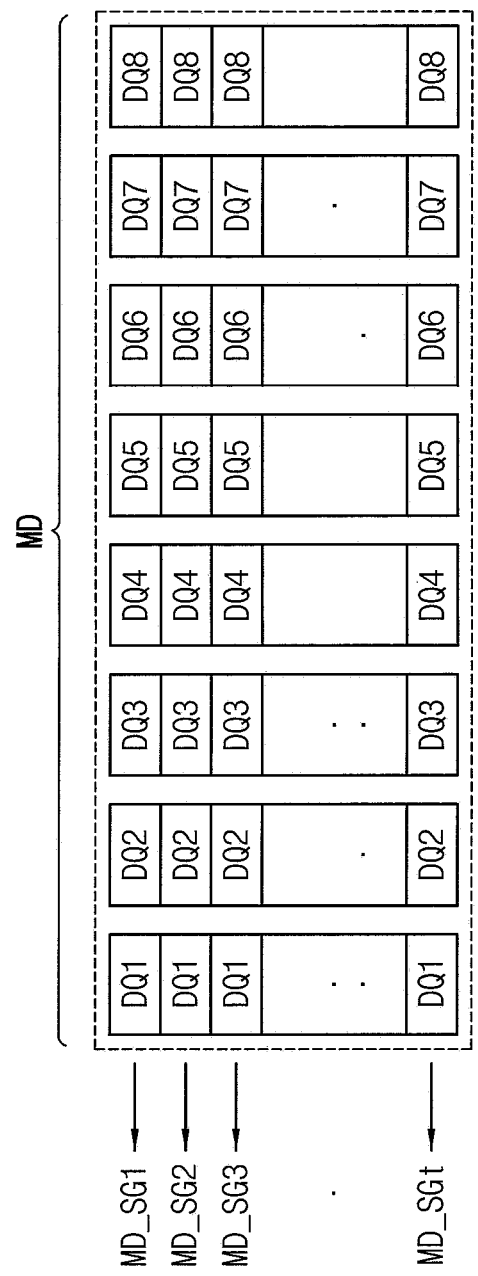
FIG. 2 illustrates a main data corresponding to the plurality of burst lengths in the memory system of FIG. 1, according to example embodiments.

FIG. 2 illustrates a main data corresponding to the plurality of burst lengths in the memory system of FIG. 1, according to example embodiments. Referring to FIG. 2, the main data MD corresponding to the plurality of burst lengths are input to/output from the semiconductor memory device 200. The main data MD includes data segments MD_SG1~MD_SGt (t is a natural number equal to or greater than 8) each corresponding to each of the plurality of burst lengths. The burst length is assumed to be 8 in FIG. 2. However, example embodiments of the present disclosure are not limited thereto. The main data MD corresponding to the plurality of burst lengths may be stored in the memory cell array 300 of the semiconductor memory device 200.

Figure 3:
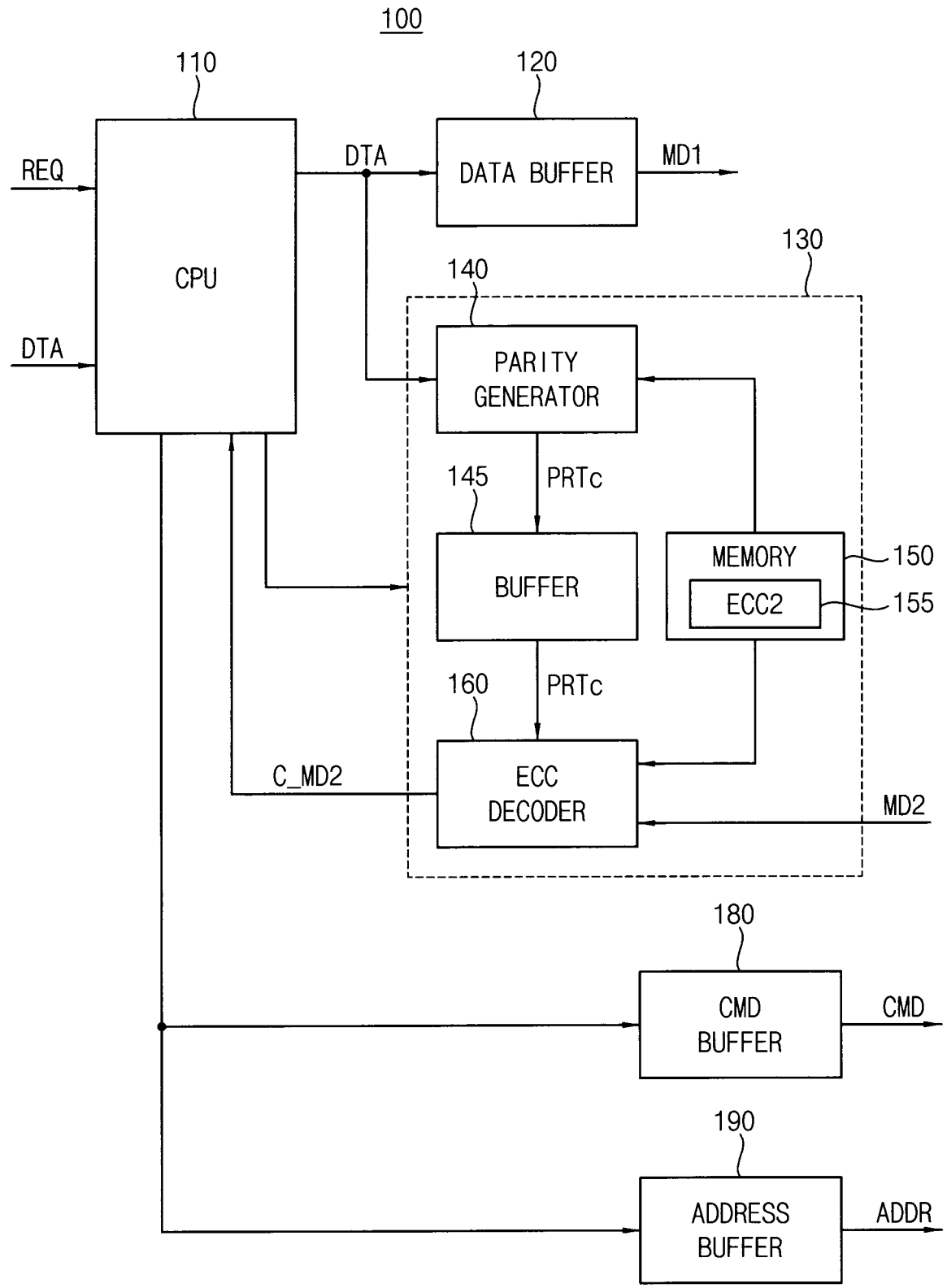
FIG. 3 is a block diagram illustrating an example of the memory controller in FIG. 1 according to example embodiments of the present disclosure.

FIG. 3 is a block diagram illustrating an example of the memory controller in FIG. 1 according to example embodiments of the present disclosure. Referring to FIG. 3, the memory controller 100 may include a central processing unit (CPU) 110, a data buffer 120, the error correction circuit 130, a command buffer 35 and an address buffer 37. The error correction circuit 130 may include a parity generator 140, a buffer 145, a memory 150 that stores a second ECC (ECC2) 155, and an ECC decoder 160. The CPU 110 receives a request REQ and a data DTA from the host, and provides the data DTA to the data buffer 120 and the parity generator 140. The data buffer 120 buffers the data DTA to provide a first main data MD1 to the semiconductor memory device 200. The parity generator 140 is connected to the memory 150, performs an ECC encoding on the data DTA using the second ECC 155 to generate a parity data PRTc and stores the parity data PRTc in the buffer 145.

The ECC decoder 160, in a read operation of the semiconductor memory device 200, receives a second main data MD2 from the semiconductor memory device 200, performs an ECC decoding on the second main data MD2 by symbol basis using the second ECC 155 and the system parity data PRTc and may provide a corrected main data C_MD2 to the CPU (110). The CPU 110 provides the corrected main data C_MD2 to the host.

The command buffer 180 stores the command CMD corresponding to the request REQ and transmits the command CMD to the semiconductor memory device 200 under control of the CPU 110. The address buffer 190 stores the address ADDR and transmits the address ADDR to the semiconductor memory device 200 under control of the CPU 110.

Figure 4:
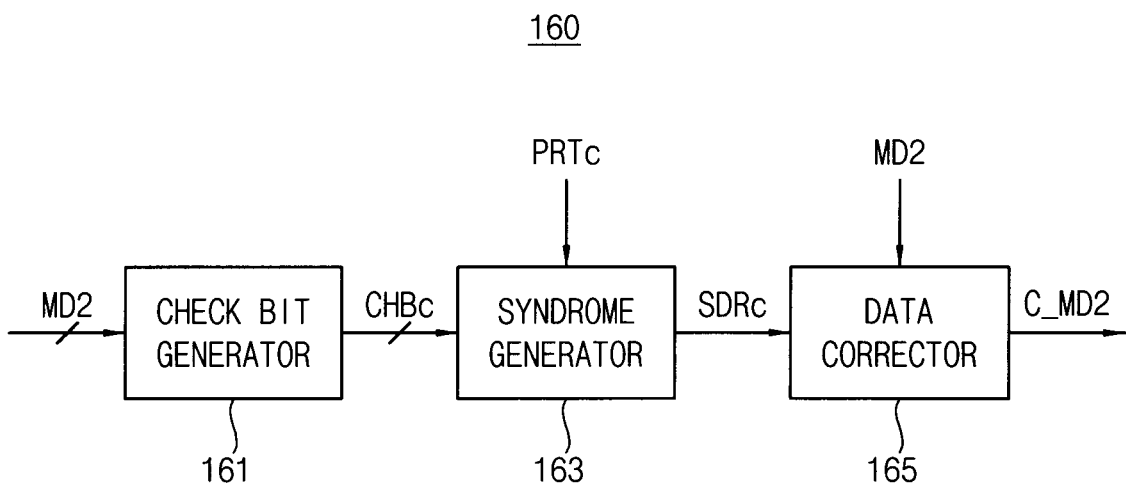
FIG. 4 is a block diagram illustrating an example of the ECC decoder in FIG. 3, according to example embodiments of the present disclosure.

FIG. 4 is a block diagram illustrating an example of the ECC decoder in FIG. 3, according to example embodiments of the present disclosure. Referring to FIG. 4, the ECC decoder 160 may include a check bit generator 161, a syndrome generator 163 and a data corrector 165. The check bit generator 161 receives the second main data MD2, and generates check bits CHBc corresponding to the second main data MD2 using the second ECC 155. The syndrome generator 163 compares the system parity data PRTc and the check bits CHBc by symbol basis to generate a syndrome data SDRc indicating whether the second main data MD2 includes at least one error bit and indicating a position of the at least one error bit. The data corrector 165 receives the second main data MD2 and corrects the error bits in the second main data MD2 by symbol basis based on the syndrome data SDRc to output the corrected main data C_MD2.

Multiple error bits and a mis-corrected bit generated due to the multiple error bits in the second main data MD2 provided from the semiconductor memory device 200 are gathered in one symbol or some symbols, the data corrector 165 may correct the error bits in the second main data MD2 by symbol basis.

Figure 5:
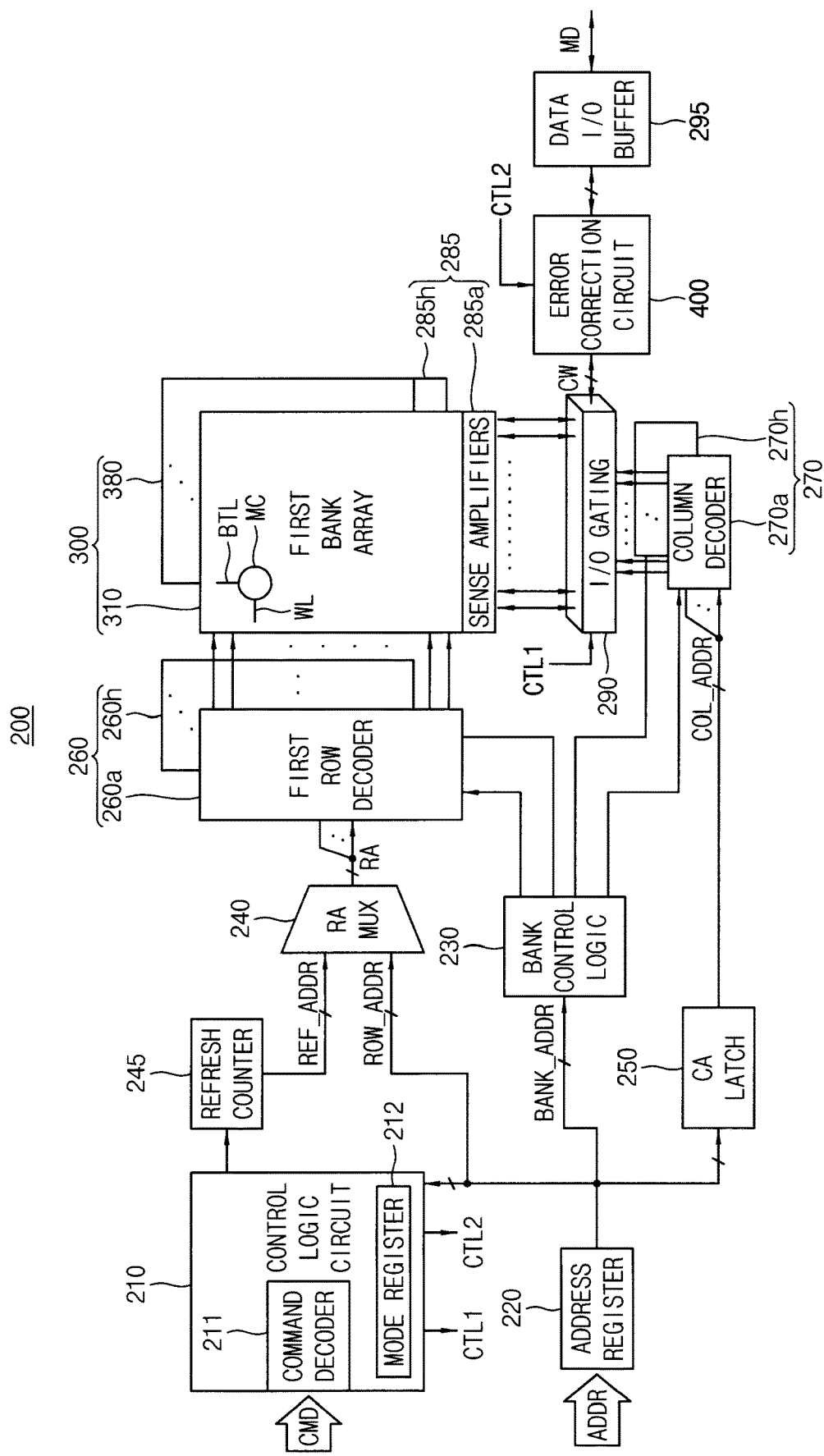
FIG. 5 is a block diagram illustrating the semiconductor memory device in FIG. 1, according to example embodiments of the present disclosure.

FIG. 5 is a block diagram illustrating the semiconductor memory device in FIG. 1, according to example embodiments of the present disclosure. Referring to FIG. 5, the semiconductor memory device 200 includes a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, and an error correction circuit 400.

The memory cell array 300 includes first through eighth bank arrays 310~380. The row decoder 260 includes first through eighth bank row decoders 260a~260h respectively coupled to the first through eighth bank arrays 310~380. The column decoder 270 includes first through eighth bank column decoders 270a~270h respectively coupled to the first through eighth bank arrays 310~380. The sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and first through eighth bank sense amplifiers 285a~285h may form first through eighth banks. In addition, each of the first through eighth bank arrays 310~380 may be divided into a plurality of sub array blocks arranged in a first direction and a second direction. Each of the first through eighth bank arrays 310~380 includes a plurality of memory cells MC coupled to word-lines WL and bit-lines BTL.

Although the semiconductor memory device 200 is illustrated in FIG. 5 as including eight banks, example embodiments of the present disclosure are not limited thereto, and the semiconductor memory device 200 may include any number of banks.

The address register 220 receives an address ADDR including a bank address BANK_ADDR, a row address ROW ADDR and a column address COL_ADDR, and a command CMD from the memory controller 100.

The address register 220 may provide the received bank address BANK_ADDR to the bank control logic 230, the received row address ROW ADDR to the row address multiplexer 240, and the received column address COL_ADDR to the column address latch 250. The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output one of the row address ROW_ADDR the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In example embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 to output data corresponding to the column address COL_ADDR or a mapped column address MCA. The I/O gating circuit 290 includes circuitry for gating input/output data. The I/O gating circuit 290 further includes read data latches for storing data that is output from the first through eighth bank arrays 310~380, and write drivers for writing data to the first through eighth bank arrays 310~380.

Codeword CW to be read from one bank array of the first through eighth bank arrays 310~380 may be sensed by a sense amplifier coupled to the one bank array from which the codeword is to be read, and may be stored in the read data latches. The codeword CW stored in the read data latches is ECC-decoded by the error correction circuit 400 and may be provided to the memory controller 100 via the data I/O buffer 295. Data (or the main data) MD to be written in one bank array of the first through eighth bank arrays 310~380 may be provided to the data I/O buffer 295 from the memory controller 100. The main data MD is provided to the error correction circuit 400.

The error correction circuit 400 performs ECC encoding on the main data MD to generate a parity data, and provides the I/O gating circuit 290 with the codeword CW including the main data MD and the parity data. The I/O gating circuit 290 may store the main data MD and the parity data in (k+1) target sub array blocks in the second direction among the sub array blocks such that a portion of the (k+1) target sub array blocks store both of a portion of the main data and a portion of the parity data based on a first control signal CTL from the control logic circuit 210. Here, k is an even integer greater than two.

When the error correction circuit 400 performs the ECC encoding and the ECC decoding, the error correction circuit 400 may use a first ECC which is represented by a generation matrix. For example, the data structure/data format of the first ECC may be a generation matrix. The first ECC may include a plurality of column vectors corresponding to data bits of the data (or main data) MD and parity bits of the parity data, and the column vectors may be divided into a plurality of code groups corresponding to a plurality of sub data units and the parity data. The data bits may be divided into the plurality of sub data units.

In addition, the column vectors may have elements to restrict a location of a sub data unit in which a mis-corrected bit occurs, generated by multiple error bits of the main data MD, which are uncorrectable by the ECC. That is, the column vectors may have elements to place the mis-corrected bit and the multiple error bits in one symbol or multiple symbols. The symbol may include one sub data unit or two adjacent sub data units.

Therefore, when the main data MD includes the multiple error bits which the error correction circuit 400 is not capable of correcting/detecting, the memory controller 100 may correct the multiple error bits in the main data MD by symbol basis at a system level because the multiple error bits and the mis-corrected bit are gathered in one sub data unit or two adjacent sub data units.

The control logic circuit 210 may control operations of the semiconductor memory device 200. For example, the control logic circuit 210 may generate control signals for the semiconductor memory device 200 to perform a write operation or a read operation. The control logic circuit 210 may include a command decoder 211 that decodes the command CMD received from the memory controller 100, and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, and a second control signal CTL2 to control the error correction circuit 400.

Figure 6:
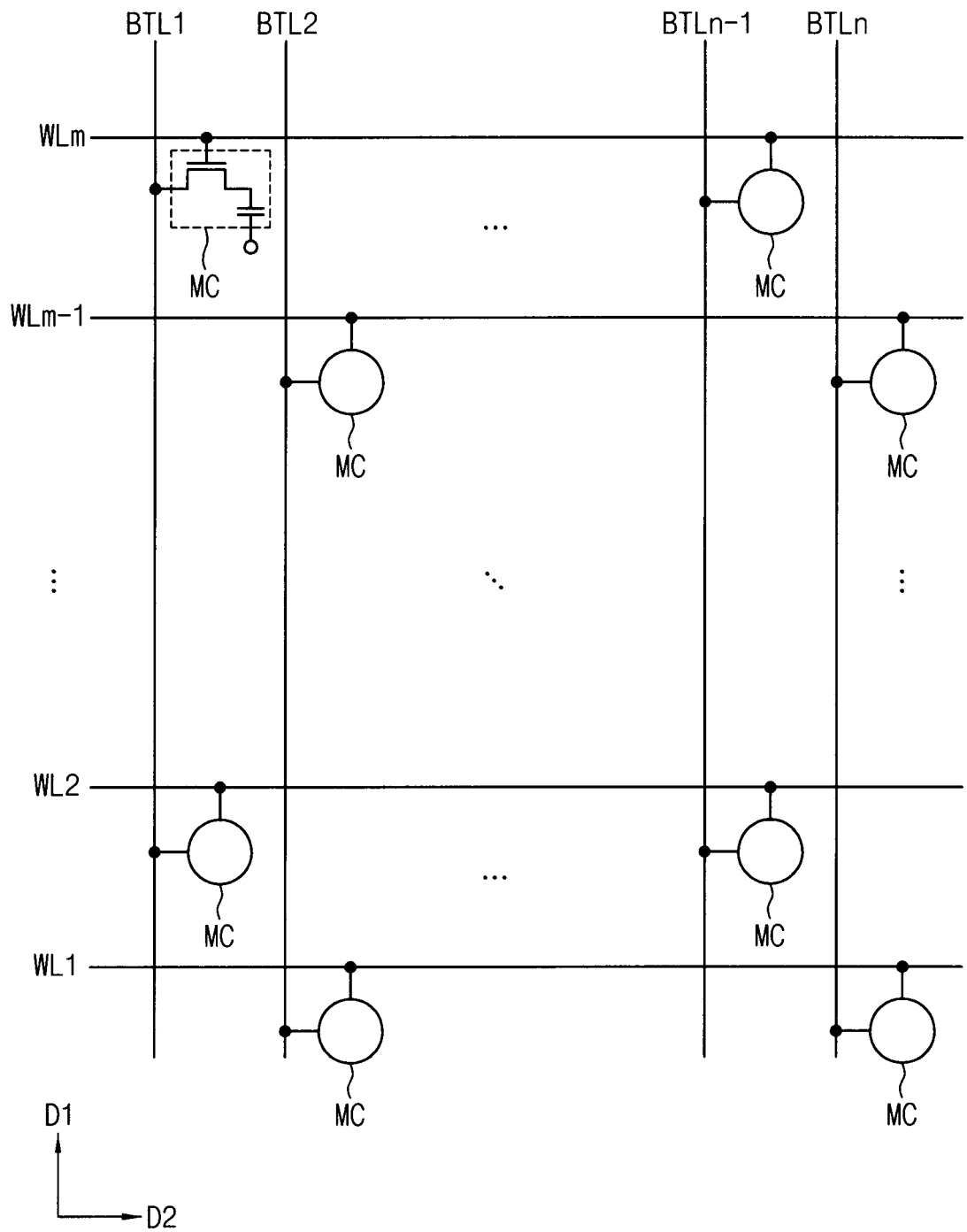
FIG. 6 illustrates an example of the first bank array in the semiconductor memory device of FIG. 5, according to example embodiments of the present disclosure.

FIG. 6 illustrates an example of the first bank array in the semiconductor memory device of FIG. 5, according to example embodiments of the present disclosure. Referring to FIG. 6, the first bank array 310 a plurality of word-lines WL1~WLm (where m is a natural number greater than two), a plurality of bit-lines BTL1~BTLn (where n is a natural number greater than two), and a plurality of memory cells MCs disposed at intersections between the word-lines WL1~WLm and the bit-lines BTL1~BTLn. Each of the memory cells MCs includes an access (cell) transistor coupled to each of the word-lines WL1~WLm and each of the bit-lines BTL1~BTLn and a storage (cell) capacitor coupled to the cell transistor. That is, each of the memory cells MCs has a DRAM cell structure.

Figure 7:
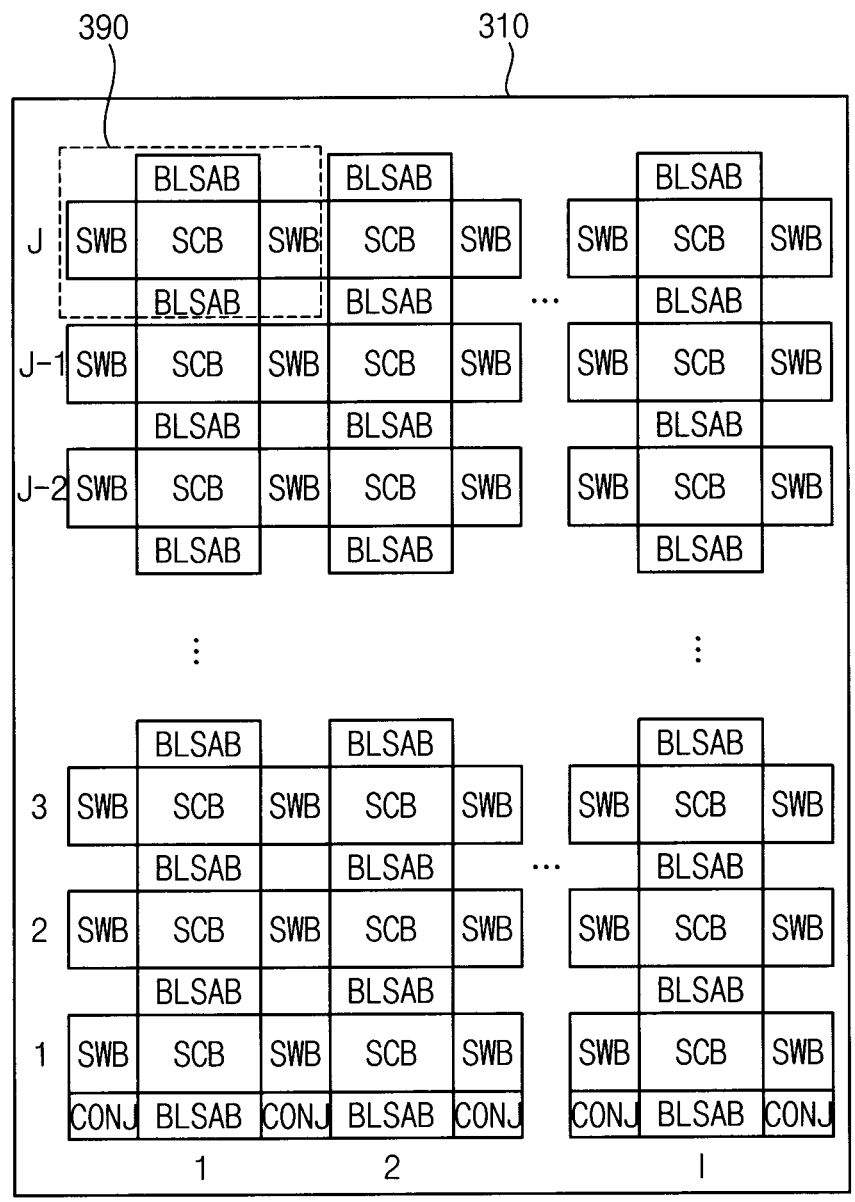
FIG. 7 illustrates an example of the first bank array in the semiconductor memory device of FIG. 5, according to example embodiments of the present disclosure.
Figure 7:

FIG. 7 illustrates an example of the first bank array in the semiconductor memory device of FIG. 5, according to example embodiments of the present disclosure. Referring to FIG. 7, in the first bank array 310, I sub-array blocks SCB may be disposed in the second direction D2, and J sub-array blocks SCB may be disposed in the first direction D1 substantially perpendicular to the second direction D2. I and J represent a number of the sub-array blocks SCB in the second direction and the first direction, respectively, and are natural numbers greater than two. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the second direction D2. Sub word-line drivers may be disposed in the sub word-line driver regions SWB. J+1 bit-line sense amplifier regions BLSAB may be disposed, for example between the sub-array blocks SCB in the first direction D1. Bit-line sense amplifiers to sense data stored in the memory cells may be disposed in the bit-line sense amplifier regions BLSAB.

A plurality of conjunction regions CONJ may be disposed adjacent the sub word-line driver regions SWB and the bit-line sense amplifier regions BLSAB. A voltage generator is disposed in each of the conjunction regions CONJ. A portion 390 in the first bank array 310 may be described with reference to FIG. 8 below.

Figure 8:
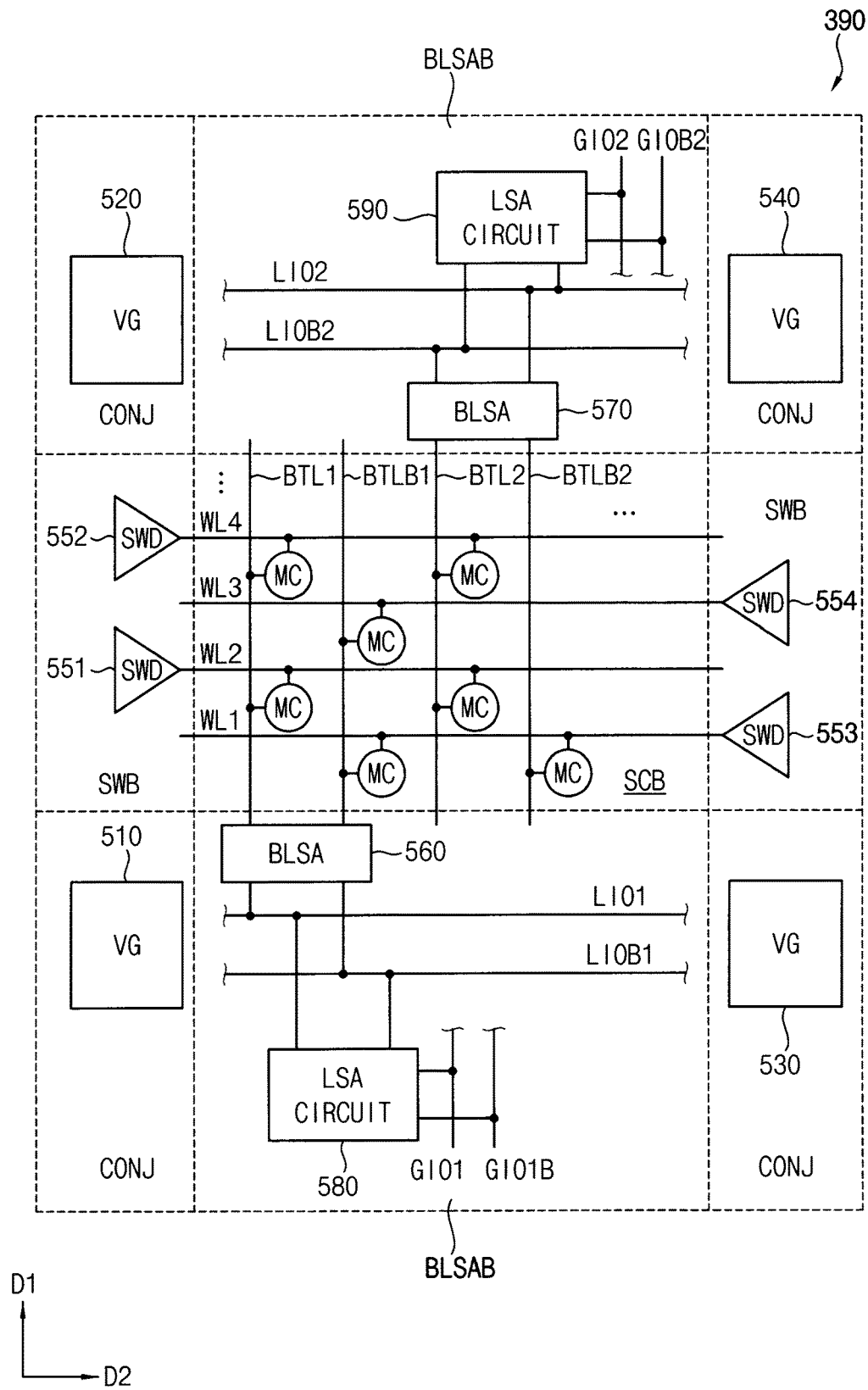
FIG. 8 illustrates a portion of the first bank array in FIG. 7 according to example embodiments of the present disclosure.
Figure 9:
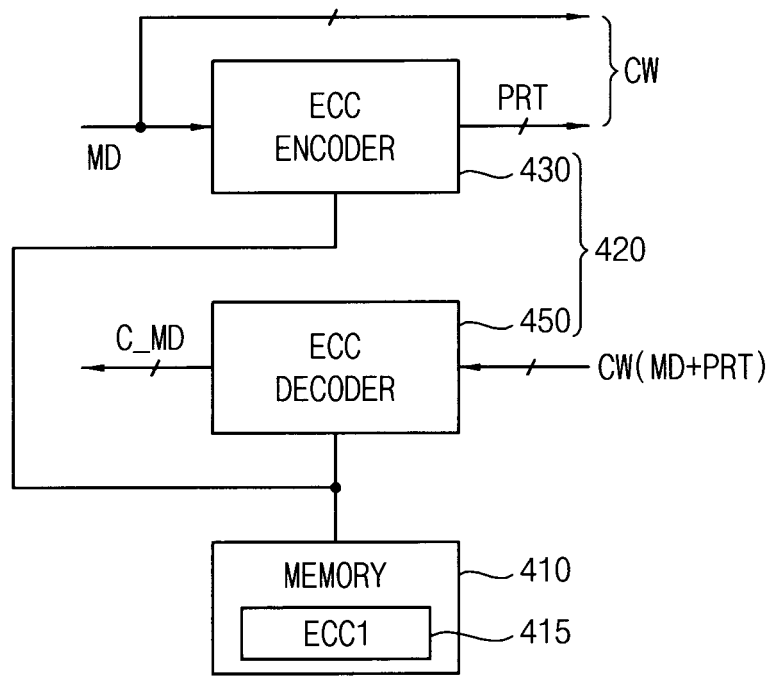
FIG. 9 is a block diagram illustrating an example of the error correction circuit in the semiconductor memory device of FIG. 5, according to example embodiments of the present disclosure.

FIG. 8 illustrates a portion of the first bank array in FIG. 7 according to example embodiments of the present disclosure. Referring to FIGS. 8 and 9, in the portion 390 of the first bank array 310, the sub-array block SCB, the bit-line sense amplifier regions BLSAB, the sub word-line driver regions SWB and the conjunction regions CONJ are disposed.

The sub-array block SCB includes a plurality of word-lines WL1~WL4 extending in a row direction (the second direction D2) and a plurality of bit-line pairs BTL1~BTL2 and BTLB1~BTLB2 extending in a column direction (the first direction D1). The sub-array block SCB includes a plurality of memory cells MCs disposed at intersections between the word-lines WL1~WL4 and the bit-line pairs BTL1~BTL2 and BTLB1~BTLB2.

With reference to FIG. 8, the sub word-line driver regions SWB include a plurality of sub word-line drivers 551, 552, 553 and 554 that respectively drive the word-lines WL1~WL4. The sub word-line drivers 551 and 552 may be disposed in the sub word-line driver region SWB, which is leftward (in this example), with respect to the sub-array block SCB. In addition, the sub word-line drivers 553 and 554 may be disposed in the sub word-line driver region SWB, which is rightward (in this example), with respect to the sub-array block SCB.

The bit-line sense amplifier regions BLSAB include bit-line sense amplifiers BLSA 560 and 570 coupled to the bit-line pairs BTL1~BTL2 and BTLB1~BTLB2, and local sense amplifier circuits 580 and 590. The bit-line sense amplifier 560 may sense and amplify a voltage difference between the bit-line pair BL and BLB to provide the amplified voltage difference to a local I/O line pair LIO1 and LIOB1.

The local sense amplifier circuit 580 controls connection between the local I/O line pair LIO1 and LIOB1 and a global I/O line pair GIO1 and GIOB1, and the local sense amplifier circuit 590 controls connection between the local I/O line pair LIO2 and LIOB2 and a global I/O line pair GIO2 and GIOB2.

As illustrated in FIG. 8, the bit-line sense amplifiers 560 and 570 may be alternately disposed at an upper portion and a lower portion of the sub-array block SCB. The conjunction regions CONJ are disposed adjacent to the bit-line sense amplifier regions BLSAB, the sub word-line driver regions SWB and the sub-array block SCB. A plurality of voltage generators 510, 520, 530 and 540 may be disposed in the conjunction regions CONJ.

FIG. 9 is a block diagram illustrating an example of the error correction circuit in the semiconductor memory device of FIG. 5, according to example embodiments of the present disclosure. Referring to FIG. 9, an error correction circuit 400a includes an (ECC) memory 410, an ECC encoder 430, and an ECC decoder 450. The ECC memory 410 stores a first ECC 415. The first ECC 415 may be represented by a generation matrix (e.g., a data format/structure of the first ECC 415 may be a generation matrix), and may include a plurality of column vectors corresponding to data bits in the main data (e.g., MD) and the parity data.

The ECC encoder 430 is connected to the ECC memory 410, and may perform ECC encoding on the main data MD using the first ECC 415 stored in the ECC memory 410 to generate the parity data PRT in a write operation of the semiconductor memory device 200. The ECC encoder 430 may provide the I/O gating circuit 290 with the codeword CW including the main data MD and the parity data PRT.

The ECC decoder 450 is connected to the ECC memory 410, may receive the codeword CW including the main data MD and the parity data PRT, may perform ECC decoding on the main data MD based on the parity data PRTR using the first ECC 415 to correct and/or detect an error bit in the main data MD, and may output corrected main data C_MD. The first ECC 415 may be a single error correction and double error detection (SECDED) code capable of correcting an error bit and detecting two error bits in the main data MD. The ECC 415 may be implemented with one of various codes.

Although it is described with reference to FIG. 9 that the ECC memory 410 is coupled to the ECC encoder 430 and the ECC decoder 450, in example embodiments, the ECC memory 410 may be implemented with exclusive OR gates within the ECC encoder 430 and the ECC decoder 450.

Figure 10:
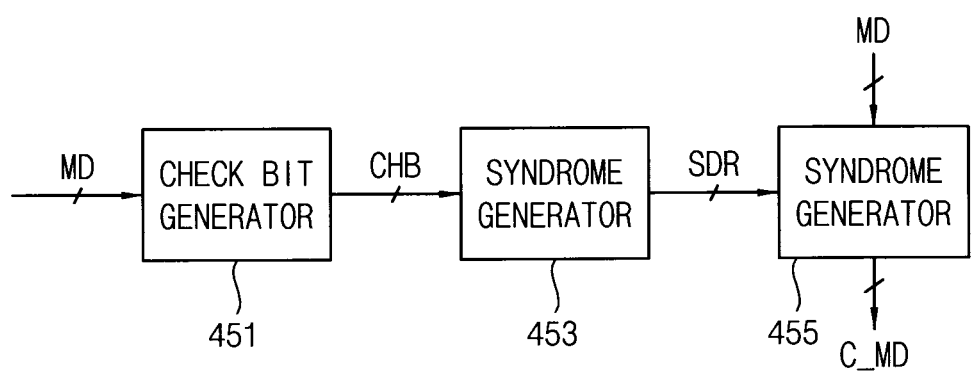
FIG. 10 is a block diagram illustrating the ECC decoder in the error correction circuit of FIG. 9, according to example embodiments of the present disclosure.

FIG. 10 is a block diagram illustrating the ECC decoder in the error correction circuit of FIG. 9, according to example embodiments of the present disclosure. Referring to FIG. 10, the ECC decoder 450 includes a check bit generator 451, a syndrome generator 453, and a data corrector 455. The check bit generator 451 generates check bits CHB based on the data bits in the main data MD using the first ECC 415. The syndrome generator 453 generates syndrome data SDR indicating whether an error bit occurs and a position of the error bit based on a comparison of the check bits CHB and parity bits of the parity data PRT. The data corrector 455 receives the main data MD and the syndrome data SDR, corrects the error bit in the main data MD, and outputs the corrected main data C_MD.

In FIGS. 9 and 10, the main data MD includes $2^p$-bit of the data bits (where p is an integer equal to or greater than seven), and the parity data PRT includes (p+1)-bit parity bits. But, in other example embodiments, the main data MD includes $3*2^q$-bit off the data bits (where q is an integer equal to or greater than six), and the parity data PRT includes (q+2)-bit parity bits.

Figure 11:
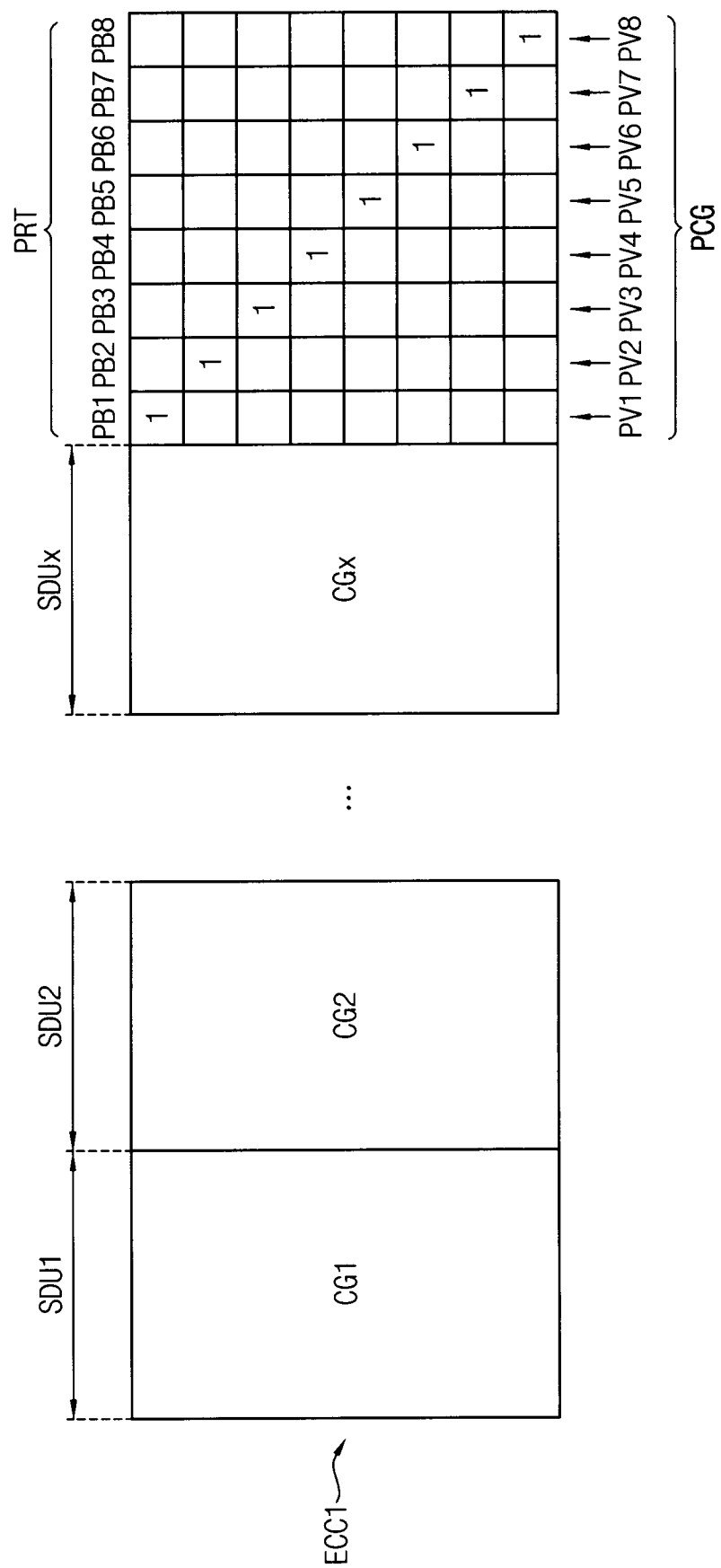
FIG. 11 illustrates relationships of the first ECC, and the parity bits used in the error correction circuit of FIG. 9, according to example embodiments of the present disclosure.

FIG. 11 illustrates relationships of the first ECC, and the parity bits used in the error correction circuit of FIG. 9, according to example embodiments of the present disclosure. In FIG. 11, it is assumed that the main data MD includes a plurality of sub data units SDU1~SDUx, and the parity data PRT includes 8-bit parity bits PB1~PB8. In FIG. 11, it is assumed that x is a natural number equal to or greater than eight.

Referring to FIG. 11, the first ECC 415 may be divided into a plurality of code groups CG1~CGx and PCG corresponding to the plurality of sub data units SDU1~SDUx and the parity data PRT. The code group PCG may include a plurality of column vectors PV1~PV8 corresponding to parity bits PB1~PB8 of the parity data PRT.

Figure 12:
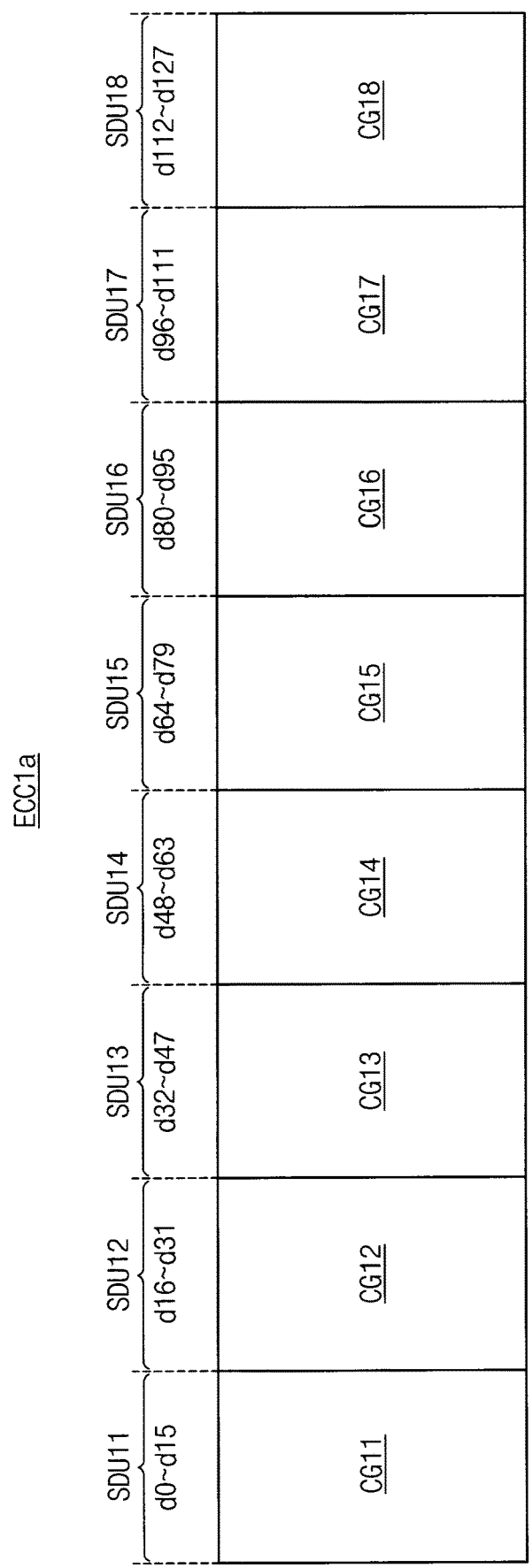
FIG. 12 illustrates an example of the first ECC according to example embodiments of the present disclosure.

FIG. 12 illustrates an example of the first ECC according to example embodiments of the present disclosure. In FIG. 12, it is assumed that the main data MD includes 128-bit data bits d0~d127. That is, it is assumed that x is eight in FIG. 11. Referring to FIG. 12, the data bits d0~d127 of the main data MD may be divided into first through eighth sub data units SDU11~SDU18. Each of the first through eighth sub data units SDU11~SDU18 includes 16-bit data bits. A first ECC ECC1a includes first through eighth code groups CG11~CG18 corresponding to the first through eighth sub data units SDU11~SDU18.

Figure 13:
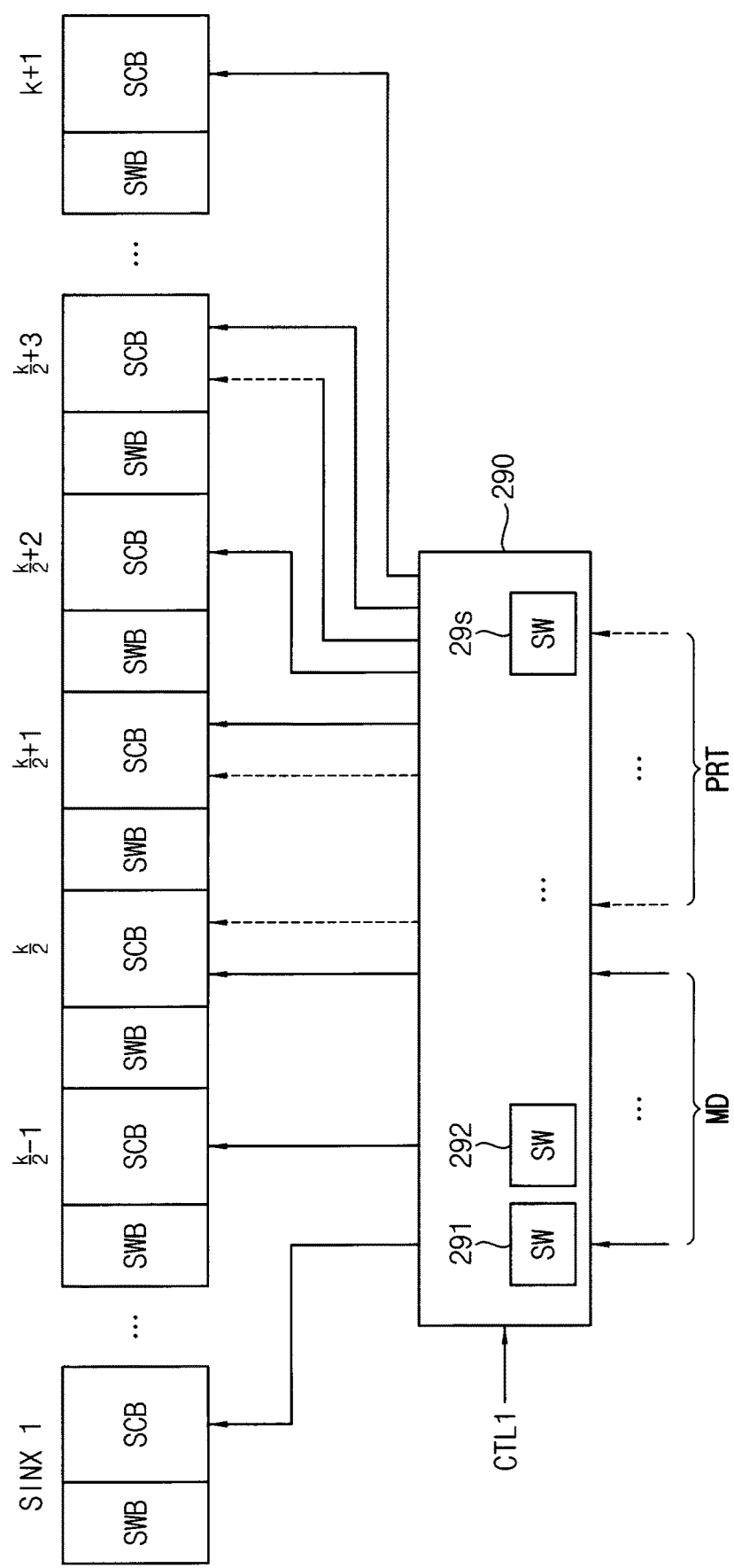
FIG. 13 illustrates an example of how the main data and the parity data can be stored in the sub array blocks in FIG. 7.

FIG. 13 illustrates that the main data and the parity data are stored in the sub array blocks in FIG. 7. In FIG. 13 the I/O gating circuit 290 is also illustrated for convenience of explanation and the I/O gating circuit 290 may include a plurality of switches 291~29s which are turned-on/off in response to the first control signal CTL1. Here, s is an integer greater than two. Referring to FIG. 13, the main data MD and the parity data PRT are stored in (k+1) target sub array blocks among row blocks in the sub array blocks SCB in FIG. 7, the row blocks are arranged in the second direction D2 and the (k+1) target sub array blocks are designated by the row address ROW ADDR. Here, k is an integer greater than three.

If the target sub array blocks include first through (k+1)_th sub array blocks, which are identified by index SINX, both of the main data MD and the parity data PRT are stored in the k/2_th sub array block, the (k/2+1)_th sub array block and the (k/2+3)_th sub array block, and the main data MD is stored in other sub array blocks except the k/2_th sub array block, the (k/2+1)_th sub array block and the (k/2+3)_th sub array block. The sub array blocks including the data bits of the main data MD among the first through (k+1)_th sub array blocks are referred to as a first set of sub array blocks, and the sub array blocks including both the data bits of the main data MD and the parity bits of the parity data PRT among the first through (k+1)_th sub array blocks are referred to as a second set of sub array blocks. In FIG. 13, bolded arrows represent paths through which the main data MD is stored and dotted arrows represent paths through which the parity data PRT is stored.

The switches 291~29s in the I/O gating circuit 290 may provide the main data MD and the parity data PRT to corresponding sub array blocks, respectively, in response to the first control signal CTL1.

Figure 14A:
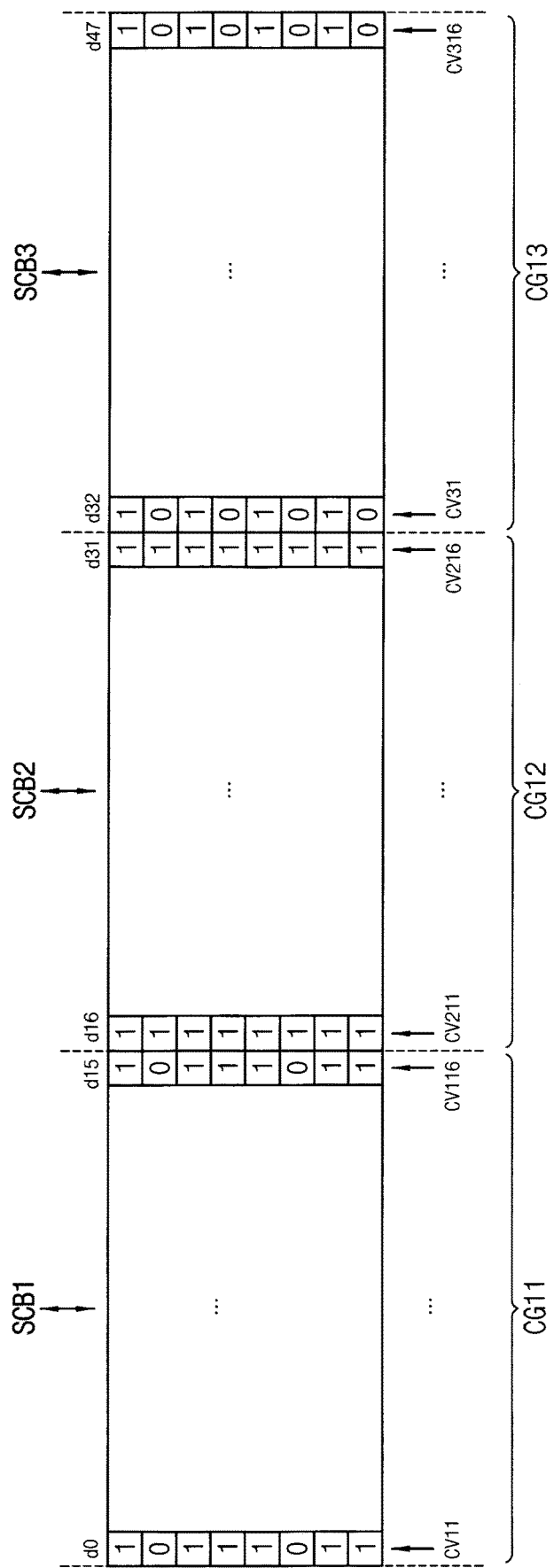
FIGS. 14A through 14C illustrate the first through eighth code groups in FIG. 11.
Figure 14B:
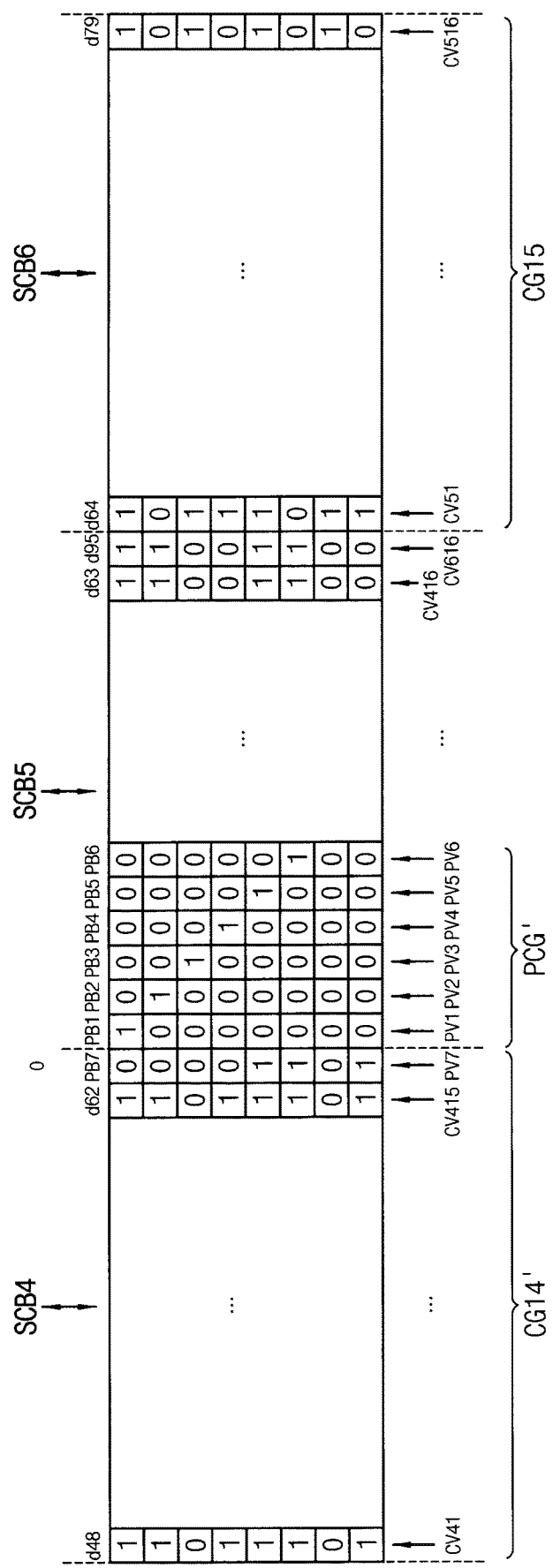
Figure 14C:
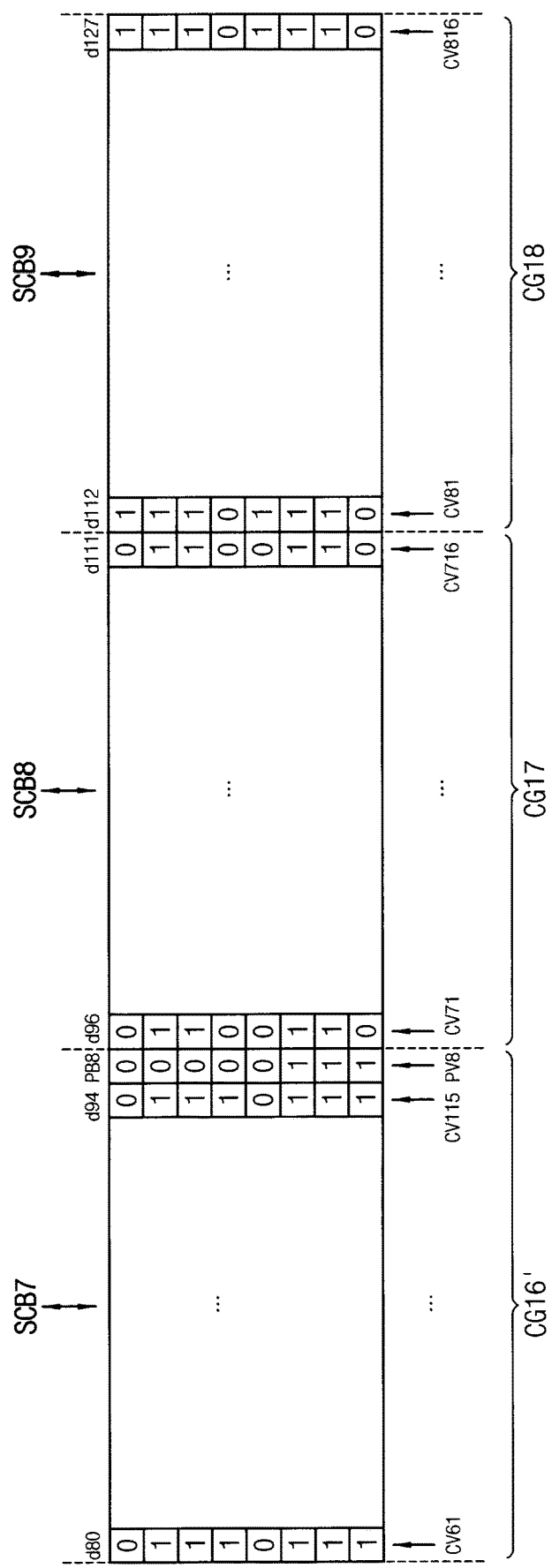

FIGS. 14A through 14C illustrate the first through eighth code groups in FIG. 11. In FIGS. 14A through 14C, it is assumed that k is eight. Referring to FIG. 14A through 41C, the first code group CG11 includes column vectors CV11~CV116 corresponding to the data bits d0~d15 of the first sub data unit SDU11, the column vectors CV11~CV116 have same elements with respect to one another, and data bits d0~d15 are stored in a sub array block SCB1. The second code group CG12 includes column vectors CV21~CV216 corresponding to the data bits d16~d31 of the second sub data unit SDU12, the column vectors CV21~CV216 have same elements with respect to one another and the data bits d16~d31 are stored in a sub array block SCB2. The third code group CG13 includes column vectors CV31~CV316 corresponding to the data bits d32~d47 of the third sub data unit SDU13, the column vectors CV31~CV316 have same elements with respect to one another and the data bits d32~d47 are stored in a sub array block SCB3.

In addition, a fourth code group CG14' includes column vectors CV41~CV415 corresponding to the data bits d48~d62 of the fourth sub data unit SDU14 and the column vector PV7 corresponding to the parity bit PB7. The column vectors CV41~CV415 have same elements with respect to one another, each of the column vectors CV41~CV415 is different from the column vector PV7 and the data bits d48~d62 and the parity bit PB7 are stored in a sub array block SCB4. The parity bits PB1~PB6 and the data bits d63 and d95 are stored in a sub array block SCB5. A code group PCG' includes the column vectors PV1~PV6 corresponding to the parity bits PB1~PB6 and the data bits d63 and d95 corresponding to column vectors CV416 and CV616. A fifth code group CG15 includes column vectors CV51~CV516 corresponding to the data bits d64~d79 of the fifth sub data unit SDU15, the column vectors CV51~CV516 have same elements with respect to one another, and data bits d64~d79 are stored in a sub array block SCB6.

In addition, a sixth code group CG16' includes column vectors CV61~CV615 corresponding to the data bits d80~d94 of the sixth sub data unit SDU16 and the column vector PV8 corresponding to the parity bit PB8. The column vectors CV61~CV615 have same elements with respect to one another, each of the column vectors CV61~CV615 is different from the column vector PV8 and the data bits d80~d94 and the parity bit PB8 are stored in a sub array block SCB7. A seventh code group CG17 includes column vectors CV71~CV716 corresponding to the data bits d96~d111 of the seventh sub data unit SDU17, the column vectors CV71~CV716 have same elements with respect to one another, and data bits d96~d111 are stored in a sub array block SCB8. An eighth code group CG18 includes column vectors CV81~CV816 corresponding to the data bits d112~d127 of the eighth sub data unit SDU18, the column vectors CV81~CV816 have same elements with respect to one another, and data bits d112~d127 are stored in a sub array block SCB9.

In FIG. 14A through 41C, the code groups CG11, CG12, CG13, CG15, CG17 and CG18 including the column vectors corresponding to the data bits are referred to as a first set of code groups and the code groups CG14', PCG' and CG16' including the column vectors corresponding to the data bits and the parity bits are referred to as a second set of code groups. Column vectors in each of code groups of the first set of code groups have same elements. Therefore, when multiple error bits occur in a first sub data unit among the plurality of sub data units corresponding to the first set of code groups, a mis-corrected bit occurs generated by multiple error bits also occurs in the first sub data unit, because a result of an exclusive OR operation on two column vectors in one of the code groups of the first set of code groups is the same as a column vector in the one of the code groups of the first set of code groups.

In addition, a seventh element of each of the column vectors in the code groups CG14' and PCG' of the second set of code groups has '0' and a seventh element of each of the column vectors in the code group CG16' of the second set of code groups has '1'. Therefore, a column vector corresponding to a result of an exclusive OR operation on two column vectors in one of the code groups of the second set of code groups includes a seventh element having '0' and a column vector representing the mis-corrected bit is similar with one of the column vectors in the code groups CG14' and PCG'. Therefore, the memory controller 100 may correct the mis-corrected bit.

That is, column vectors in the first ECC 415 have elements to restrict a location of a sub data unit in which a mis-corrected bit occurs, generated by multiple error bits of the main data MD and the multiple error bits are uncorrectable by the first ECC 415.

Figure 15A:
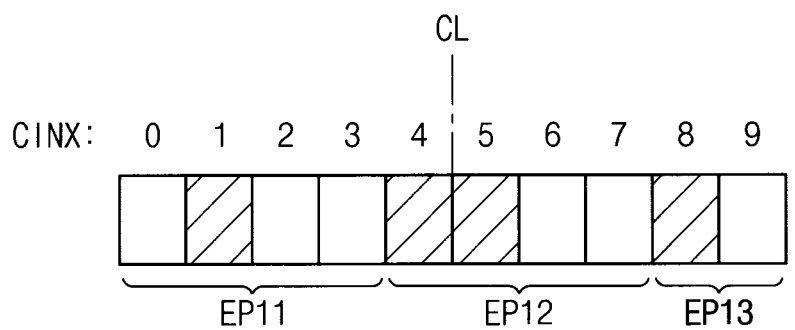
FIGS. 15A and 15B illustrate an example of how the main data and the parity data can be stored according to example embodiments of the present disclosure.
Figure 15A:
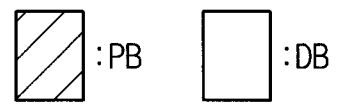
Figure 15B:
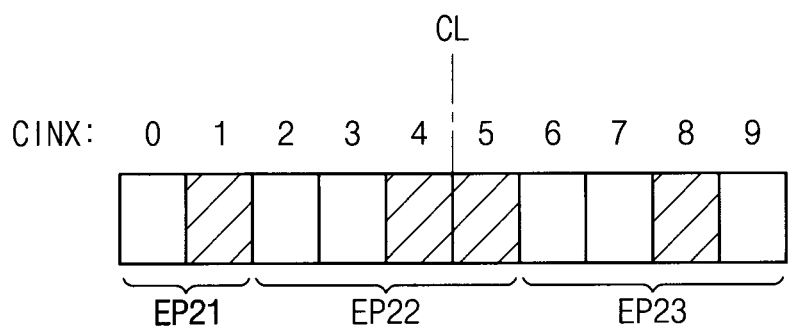
Figure 15B:

FIGS. 15A and 15B illustrate that the main data and the parity data are stored according to example embodiments of the present disclosure. Referring to FIGS. 15A and 15B, the control logic circuit 210 in FIG. 5 controls the error correction circuit 400 to store the main data MD and the parity data PRT in a target area in a target page in a memory cell array, designated by the row address ROW ADDR, to interleave the main data MD and the parity data PRT such that parity bits PB of the parity data PRT are stored symmetrically with respect to a virtual center line CL in the target area and to vary sub data patterns EP11, EP12 and EP13 and EP21, EP22 and EP23 based on a least significant bit (LSB) of the row address ROW ADDR designating the target page. The main data MD and the parity data PRT stored in the target area may constitute the sub data patterns EP11, EP12 and EP13 and EP21, EP22 and EP23.

Referring to FIG. 15A, when the LSB of the row address ROW ADDR designate an even target page, the sub data pattern EP11 includes data bit DB and parity bits PB stored in memory cells identified by cell index 0~3, the sub data pattern EP12 includes data bit DB and parity bits PB stored in memory cells identified by cell index 4~7 and the sub data pattern EP13 includes data bit DB and parity bits PB stored in memory cells identified by cell index 8 and 9. Referring to FIG. 15B, when the LSB of the row address ROW ADDR designate an odd target page, the sub data pattern EP21 includes data bit DB and parity bits PB stored in memory cells identified by cell index 0 and 1, the sub data pattern EP22 includes data bit DB and parity bits PB stored in memory cells identified by cell index 2~5 and the sub data pattern EP23 includes data bit DB and parity bits PB stored in memory cells identified by cell index 6~9.

Figure 16:
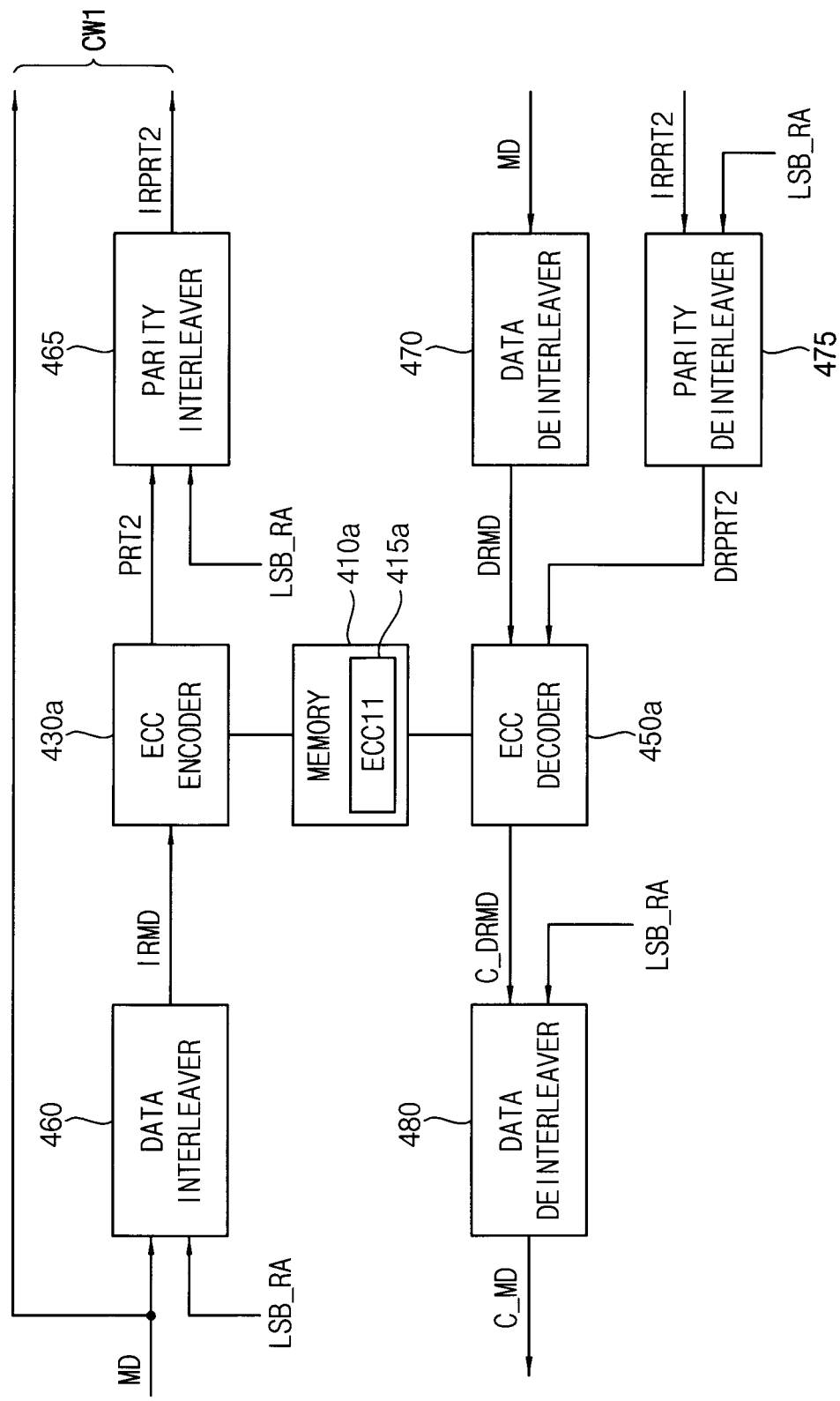
FIG. 16 is a block diagram illustrating another example of the error correction circuit in the semiconductor memory device of FIG. 5, according to example embodiments of the present disclosure.

FIG. 16 is a block diagram illustrating another example of the error correction circuit in the semiconductor memory device of FIG. 5, according to example embodiments of the present disclosure. Referring to FIG. 16, an error correction circuit 400b includes an (ECC) memory 410a, an ECC encoder 430a, an ECC decoder 450a, a data interleaver 460, a parity interleaver 465, a data deinterleaver 470, a parity deinterleaver 475 and a data deinterleaver 480.

The ECC memory 410a stores a first ECC (ECC11) 415a, the ECC encoder 430a is connected to the ECC memory 410a and the ECC decoder 450a is connected to the ECC memory 410a. The ECC encoder 430a and the ECC decoder 450a may implement an ECC engine. The data interleaver 460 may selectively interleave the main data MD based on an LSB LSB_RA of the row address to provide an intermediate main data IRMD to the ECC encoder 430a. The ECC encoder 430a performs an ECC encoding on the intermediate main data IRMD using the first ECC 415a to generate a parity data PRT2 and provides the parity data PRT2 to the parity interleaver 465.

The parity interleaver 465 may selectively interleave the parity data PRT2 based on the LSB LSB_RA of the row address to output a parity data IRPRT2. The main data MD and the parity data IRPRT2, as a codeword CW2, are stored in the target area of the target page through the I/O gating circuit 290 in FIG. 5 and parity bits of the parity data IRPRT2 are stored symmetrically whit respect to the virtual center line in the target area.

The data deinterleaver 470 may deinterleave the main data MD read from the target area to provide an intermediate data DRMD to the ECC decoder 450a. The parity deinterleaver 475 may selectively interleave the parity data IRPRT2 read from the target area based on the LSB LSB_RA of the row address to output a parity data DRPRT2. The ECC decoder 450a performs an ECC decoding on the intermediate data DRMD using the parity data DRPRT2 to correct an error bit and provides a corrected intermediate data C_DRMD to the data deinterleaver 480. The data deinterleaver 480 may selectively interleave the corrected intermediate data C_DRMD based on the LSB LSB_RA of the row address to output a corrected data C_MD.

In example embodiments, when the LSB LSB_RA of the row address designates an even target page, a sequence (an order) of bits of the main data MD and the parity data PRT2 may be maintained. In example embodiments, when the LSB LSB_RA of the row address designates an odd target page, a sequence (an order) of bits of the main data MD may be maintained and a sequence of bits of the parity data PRT2 may be inversed.

Figures 17, 18:
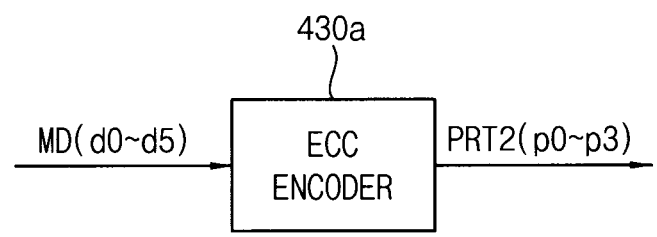
FIG. 17 illustrates an example operation of the ECC encoder in the error correction circuit of FIG. 16, according to example embodiments of the present disclosure.
FIG. 18 illustrates an example of the first ECC in the error correction circuit of FIG. 16, according to example embodiments of the present disclosure.

FIG. 17 illustrates an example operation of the ECC encoder in the error correction circuit of FIG. 16, according to example embodiments of the present disclosure. Referring to FIG. 17, when the main data includes data bits d0~d5, the ECC encoder 430a performs an ECC encoding on the data bits d0~d5 using the first ECC 415a to generate the parity data PRT2 including parity bits p0~p3.

FIG. 18 illustrates an example of the first ECC in the error correction circuit of FIG. 16, according to example embodiments of the present disclosure. Referring to FIG. 18, a first ECC ECC11a may include column vectors CV0~CV9 corresponding to the data bits d0~d5 and the parity bits p0~p3. Each of the column vectors CV0~CV9 may correspond to respective one of the bits d0, p0, d1, d2, p1, p2, d3, d4, p3 and d5. Referring back to FIG. 15A, the sub data pattern EP11 corresponds to the column vectors CV0~CV3, the sub data pattern EP12 corresponds to the column vectors CV4~CV7, and the sub data pattern EP13 corresponds to the column vectors CV8 and CV9.

Therefore, if the multiple error bits occur in the sub data pattern EP11, a mis-corrected bit generated by the multiple error bits occurs in the sub data pattern EP11 or the sub data pattern EP12. If the multiple error bits occur in the sub data pattern EP12, a mis-corrected bit generated by the multiple error bits occurs in the sub data pattern EP11 or the sub data pattern EP12. If the multiple error bits occur in the sub data pattern EP13, a mis-corrected bit generated by the multiple error bits occurs in the sub data pattern EP12 or the sub data pattern EP13.

That is, when the multiple error bits occur in one of the sub data patterns EP11, EP12 and EP13, the column vectors in the first ECC ECC11a have elements to restrict a location of at most two sub data patterns in which a mis-corrected bit, generated by the multiple error bits, occurs. The second error correction circuit 130 in the memory controller 130 has error correction capability to correct error bits in the two sub data patterns, and thus the second error correction circuit 130 may correct the multiple error bits and the mis-corrected bit.

The above description with reference to FIG. 18 may be applied to an example of FIG. 15B. The column vectors in the first ECC ECC11a have elements to restrict a location of a sub data pattern in which a mis-corrected bit, generated by the multiple error bits, occurs such that the mis-corrected bit occurs in a sub data pattern in which the multiple error bits occur or in another sub data pattern.

Figure 19:
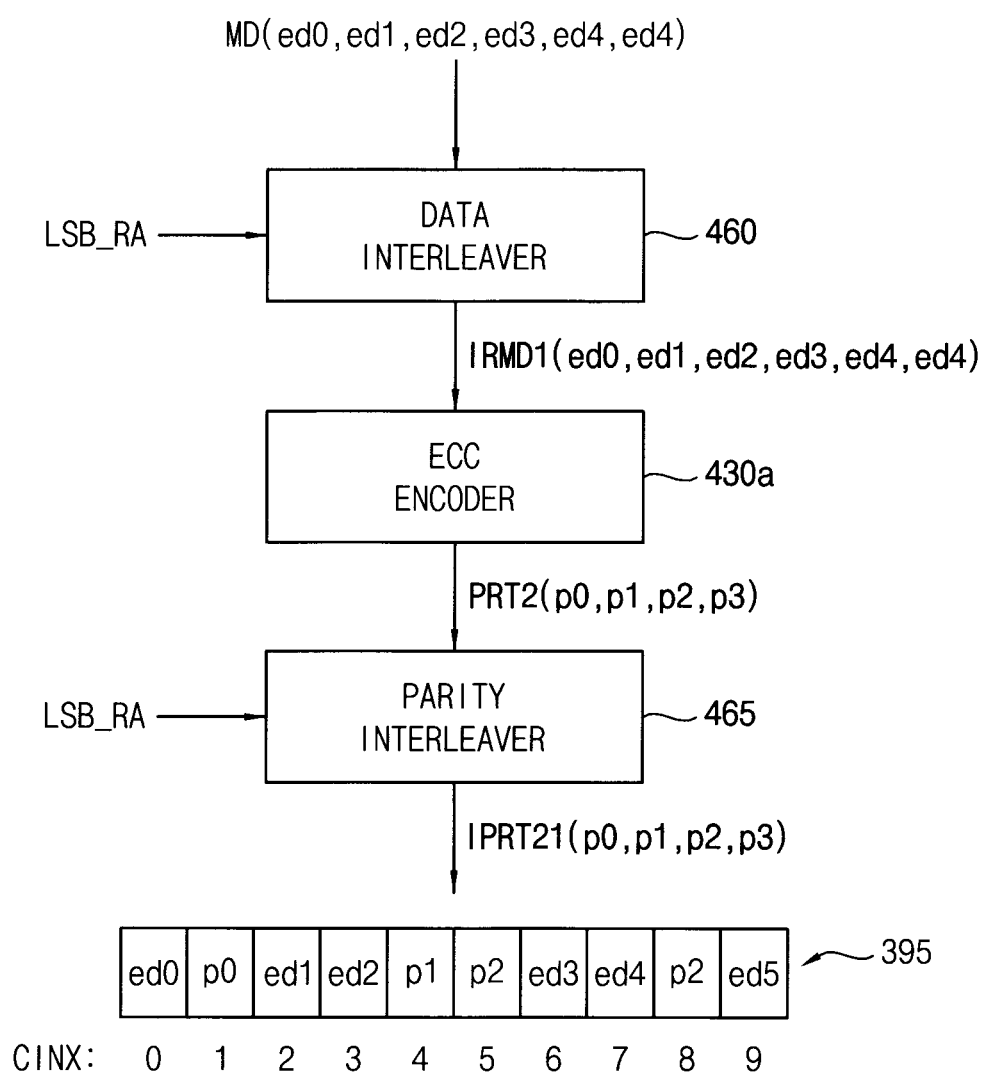
FIG. 19 illustrates an example operation of the error correction circuit of FIG. 16.

FIG. 19 illustrates an example operation of the error correction circuit of FIG. 16, when the LSB of the row address designates an even target page, according to example embodiments of the present disclosure. Referring to FIG. 19, when the LSB LSB_RA of the row address designates an even target page, the data interleaver 460 maintains a sequence of data bits ed0~ed5 of the main data MD to output an intermediate data IRMD1, the ECC encoder 430a performs an ECC encoding on the intermediate data IRMD1 to generate the parity data PRT2, the parity interleaver 465 maintains a sequence of the parity bits p0~p3 of the parity data PRT2 based on the LSB LSB_RA of the row address to output a parity data IPRT21 and the data bits ed0~ed5 and the parity bits p0~p3 of the parity data IPRT21 are stored in a target area 395.

Figure 20:
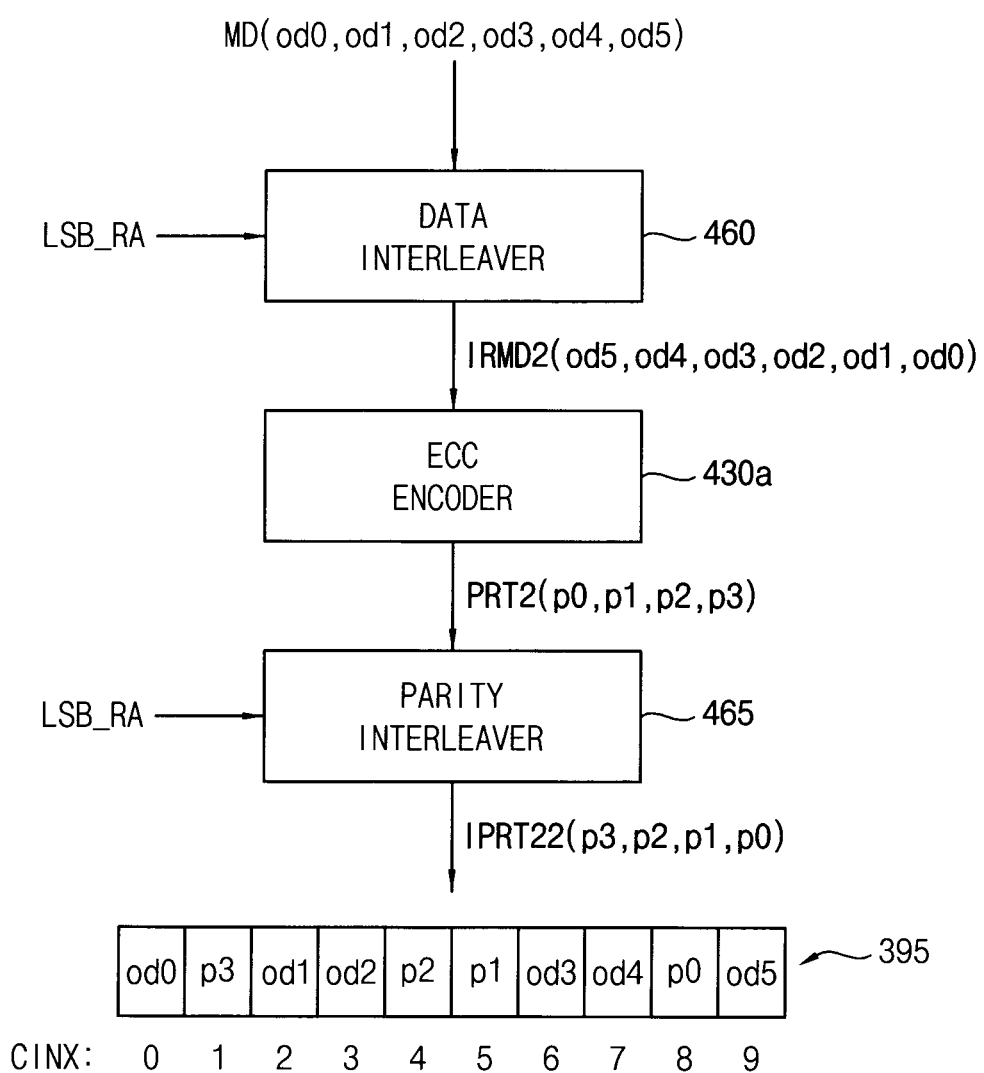
FIG. 20 illustrates an example operation of the error correction circuit of FIG. 16.

FIG. 20 illustrates an example operation of the error correction circuit of FIG. 16, when the LSB of the row address designates an odd target page, according to example embodiments of the present disclosure.

Referring to FIG. 20, when the LSB LSB_RA of the row address designates an odd target page, the data interleaver 460 reverses a sequence of data bits od0~od5 of the main data MD to output an intermediate data IRMD2, the ECC encoder 430a performs an ECC encoding on the intermediate data IRMD2 to generate the parity data PRT2, the parity interleaver 465 reverses a sequence of the parity bits p0~p3 of the parity data PRT2 based on the LSB LSB_RA of the row address to output a parity data IPRT22 and the data bits od0~od5 and the parity bits p3~p0 of the parity data IPRT23 are stored in the target area 395.

The error correction circuit 400b interleaves the parity data PRT2 such that a sequence of the parity bits of the parity data PRT2 are maintained in response to the LSB LSB_RA of the row address designating an even target page and interleaves the parity data PRT2 such that a sequence of the parity bits of the parity data PRT2 are reversed in response to the LSB LSB_RA of the row address designating an odd target page.

Figure 21:
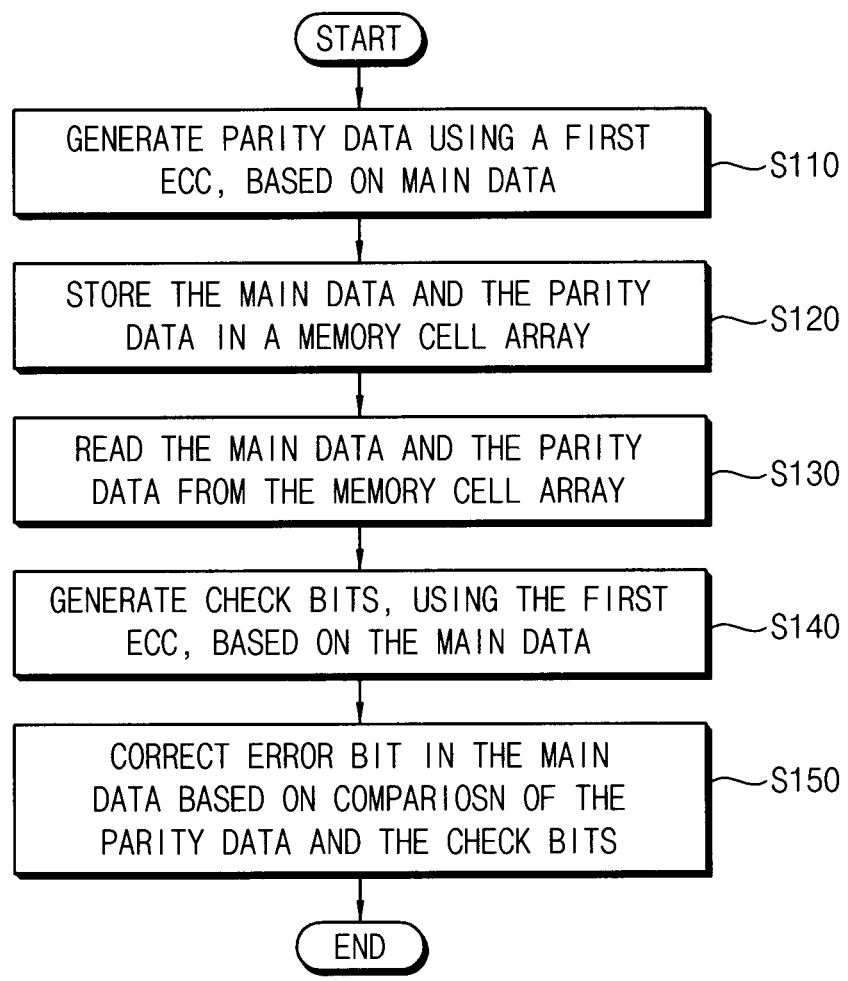
FIG. 21 is a flow chart illustrating a method of operating a semiconductor memory device, according to example embodiments of the present disclosure.

FIG. 21 is a flow chart illustrating a method of operating a semiconductor memory device, according to example embodiments of the present disclosure. Referring to FIGS. 5 through 21, in a method of operating a semiconductor memory device 200 including a memory cell array 300, an error correction circuit 400 generates a parity data PRT based on the main data MD, by using a first ECC 415 (S110).

The first ECC 415 may be represented by a generation matrix, may include a plurality of column vectors, and the column vectors may be divided into a plurality of code groups corresponding to sub data units of the main data and the parity data. The column vectors may have elements to restrict a location of a sub data unit in which a mis-corrected bit which is generated by multiple error bits of the main data occurs. The multiple error bits are uncorrectable by the first ECC 415.

The error correction circuit 400 stores the main data MD and the parity data PRT in the memory cell array 300 via an I/O gating circuit 290 (S120). The error correction circuit 400 reads the main data MD and the parity data PRT from the memory cell array 300 via the I/O gating circuit 290 (S130). The error correction circuit 400 generates check bits CHB based on the main data MD, by using the first ECC 415 (S140). The error correction circuit 400 corrects an error bit in the main data MD based on a comparison of the parity data PRT and the check bits CHB (S150).

Although the main data MD includes the multiple error bits which the error correction circuit 400 cannot correct and/or detect, the first ECC 415 has column vectors to place a mis-corrected bit in one symbol, the memory controller 100 may correct the multiple error bits and the mis-corrected bit by symbol basis. One symbol may include a data unit or two adjacent data units.

Figure 22:
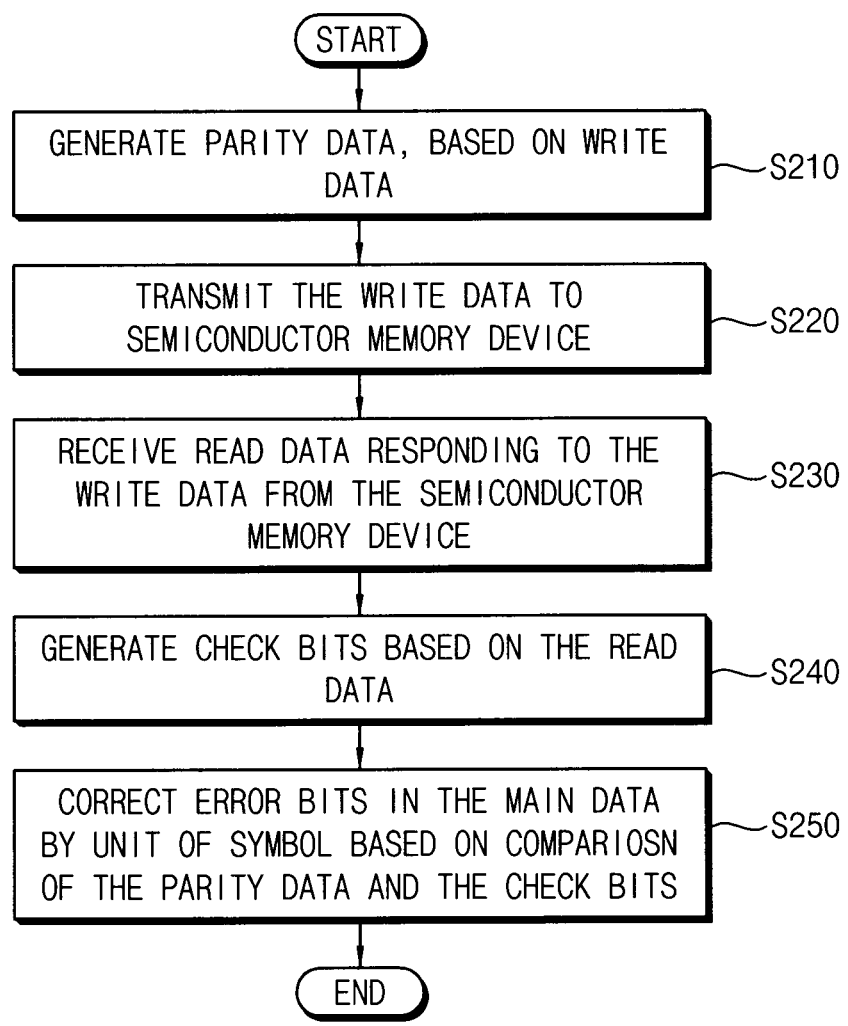
FIG. 22 is a flow chart illustrating a method of operating a memory system, according to example embodiments of the present disclosure.

FIG. 22 is a flow chart illustrating a method of operating a memory system, according to example embodiments of the present disclosure. Referring to FIGS. 1 through 20 and 22, in a method of operating a memory system 20 including a semiconductor memory device 200 and a memory controller 100 that controls the semiconductor memory device 200, an error correction circuit 130 in the memory controller 30 generates a parity data PRTc based on a write data to be transmitted to the semiconductor memory device 200 by using a second ECC 155 (S210), and stores the parity data PRTc in a buffer 145. The memory controller 100 transmits the write data to the semiconductor memory device 200 (S220).

An error correction circuit 400 in the semiconductor memory device 200 performs an ECC encoding on the write data using a first ECC 415 to generate a parity data and stores the write data and the parity data in the memory cell array 300. The error correction circuit 400 in the semiconductor memory device 200 reads the data and the parity data from the memory cell array 300 in response to a read command, performs an ECC decoding on the read data using the first ECC 415 and transmits the read data to the memory controller 100.

The memory controller 100 receives the read data responding to the write data from the semiconductor memory device 200 (S230). An ECC decoder 160 in the memory controller 100 generates check bits CHBc based on the read data by using the second ECC 155 (S240). The ECC decoder 160 corrects multiple error bits in the read data based on comparison of the system parity data PRTc and the check bits CHBc (S250).

Figure 23:
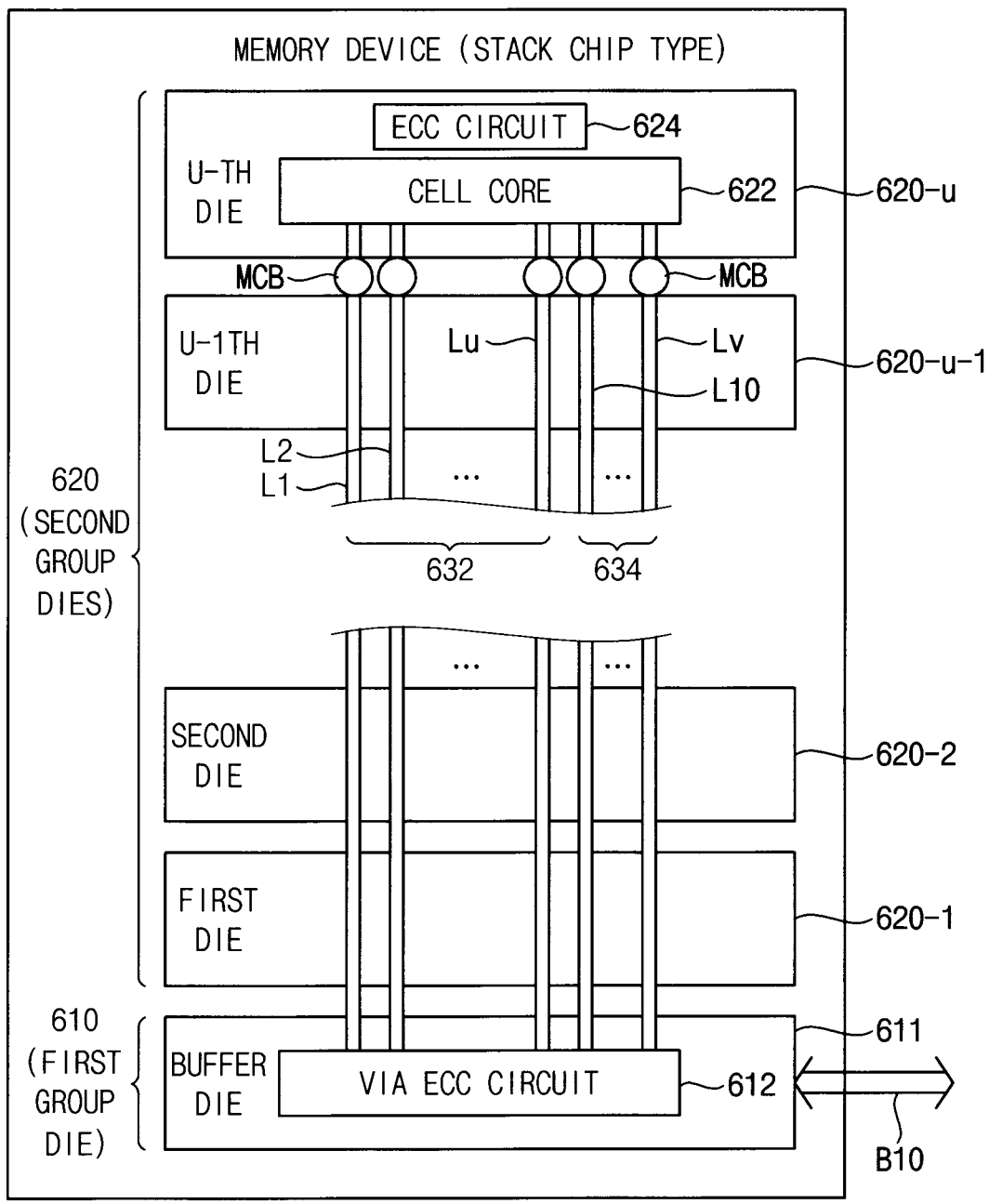
FIG. 23 is a block diagram illustrating a semiconductor memory device, according to example embodiments of the present disclosure.

FIG. 23 is a block diagram illustrating a semiconductor memory device, according to example embodiments of the present disclosure. Referring to FIG. 23, a semiconductor memory device 600 may include a first group die 610 and second group dies 620 providing a soft error analyzing and correcting function in a stacked chip structure. The second group dies 620 may be a high-bandwidth memory (HBM).

The first group die 610 may include at least one buffer die 611. The second group dies 620 may include a plurality of memory dies 620-1 to 620-$u$ (u is a natural number greater than two) which is stacked on the memory die 611 and convey data through a plurality of through a plurality of silicon via (TSV) lines. Each of the memory dies 620-1 to 620up may include a cell core 622 and an error correction circuit 624 and the cell core 622 may include a memory cell array including a plurality of sub array blocks arranged in a first direction and a second direction. The error correction circuit 624 may be referred to as an ECC circuit and may employ the error correction circuit 400a of FIG. 9 or the error correction circuit 400b of FIG. 16. Therefore, the error correction circuit 624 may include a first ECC and the first ECC may include a plurality of column vectors having elements to restrict a location of a sub data unit in which a mis-corrected bit generated by multiple error bits occurs.

The buffer die 611 may include an error correction circuit 612 which corrects a transmission error using the transmission parity bits when a transmission error is detected from the transmission data received through the TSV lines and generate error-corrected data. The error correction circuit 612 may be referred to as a via error correction circuit.

The semiconductor memory device 600 may be a stack chip type memory device or a stacked memory device which conveys data and control signals through the TSV lines. The TSV lines may also be called through electrodes. A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation. For example, when the transmission data is 128-bit data, the transmission parity bits may be set to 8 bits. However, the scope and spirit of the present disclosure are not limited thereto. The number of transmission parity bits may increase or decrease.

With the above description, a TSV line group 632 which is formed at one memory die 620-*u* may include 128 TSV lines L1 to L*u*, and a parity TSV line group 634 may include 8 TSV lines L10 to L*v*. The TSV lines L1 to L*u* of the data TSV line group 632 and the parity TSV lines L10 to L*v* of the parity TSV line group 634 may be connected to micro bumps MCB which are correspondingly formed among the memory dies 620-1 to 620-*u*.

Each of the memory dies 620-1 to 620-*u* may include DRAM cells each including at least one access transistor and one storage capacitor. The semiconductor memory device 600 may have a three-dimensional (3D) chip structure or a 2.5D chip structure to communicate with a memory controller through a data bus B10. The buffer die 610 may be connected with the memory controller through the data bus B10.

The error correction circuit 612 may determine whether a transmission error occurs at the transmission data received through the data TSV line group 632, based on the transmission parity bits received through the parity TSV line group 634. When a transmission error is detected, the error correction circuit 612 may correct the transmission error on the transmission data using the transmission parity bits. When the transmission error is uncorrectable, the error correction circuit 612 may output information indicating occurrence of an uncorrectable data error.

Figure 24:
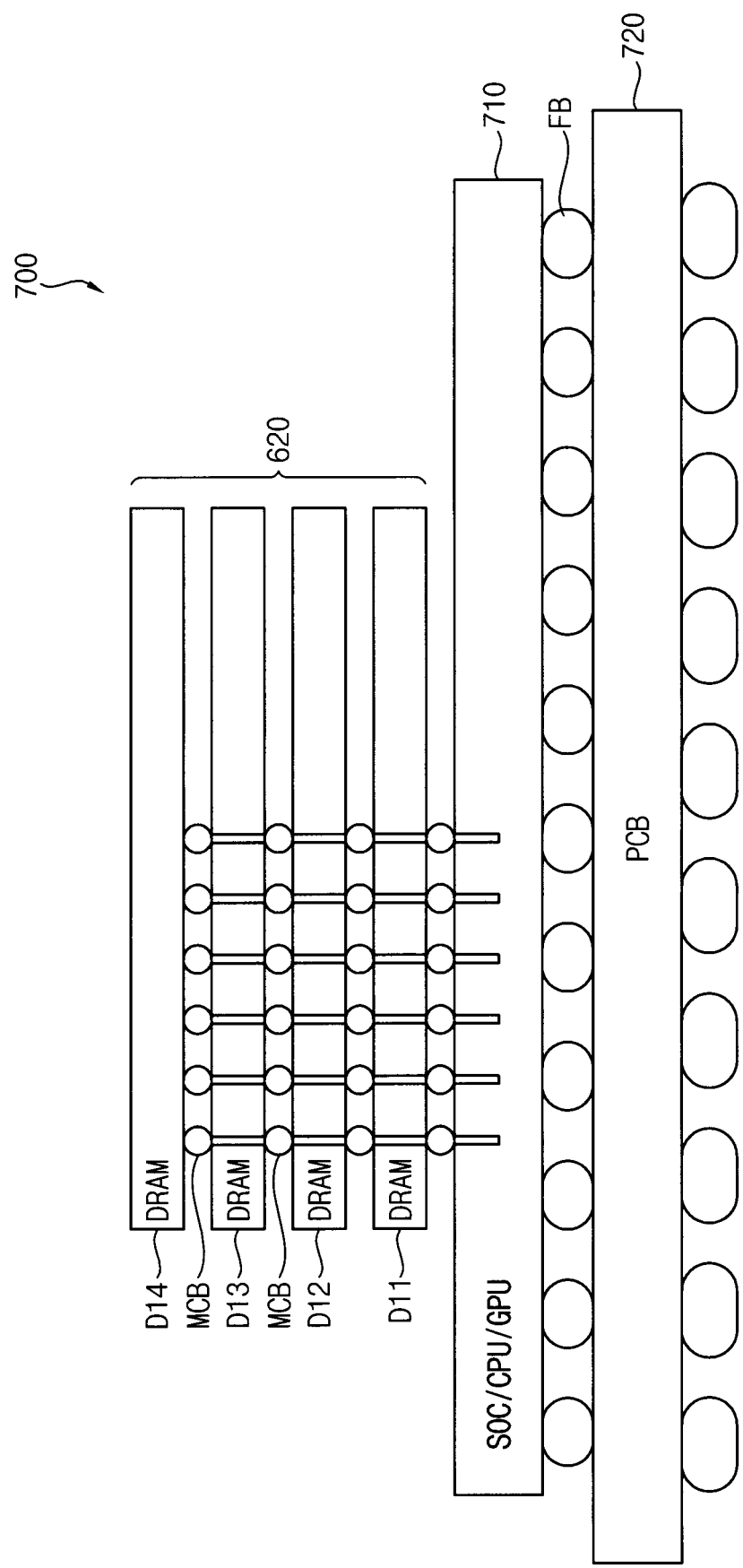
FIG. 24 is a cross-sectional view of a 3D chip structure employing the semiconductor memory device of FIG. 23, according to example embodiments of the present disclosure.

FIG. 24 is a cross-sectional view of a 3D chip structure employing the semiconductor memory device of FIG. 23, according to example embodiments of the present disclosure. FIG. 24 shows a 3D chip structure 700 in which a host and a HBM are directly connected without an interposer layer. Referring to FIG. 24, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 720 to implement a HBM structure 620 as the memory dies in FIG. 23. In FIG. 24, the buffer die 610 or a logic die of FIG. 19 is omitted. However, the buffer die 610 or the logic die may be disposed between the memory die D11 and the host die 720.

To implement the HBM (620) structure, TSV lines may be formed at the memory dies D11 and D14. The TSV lines may be electrically connected with micro bumps MCB placed between memory dies. In addition, each of the memory dies D11 to D14 may include an error correction circuit such as the error correction circuit 400*a* of FIG. 9 or the error correction circuit 400*b* of FIG. 16.

Figure 25:
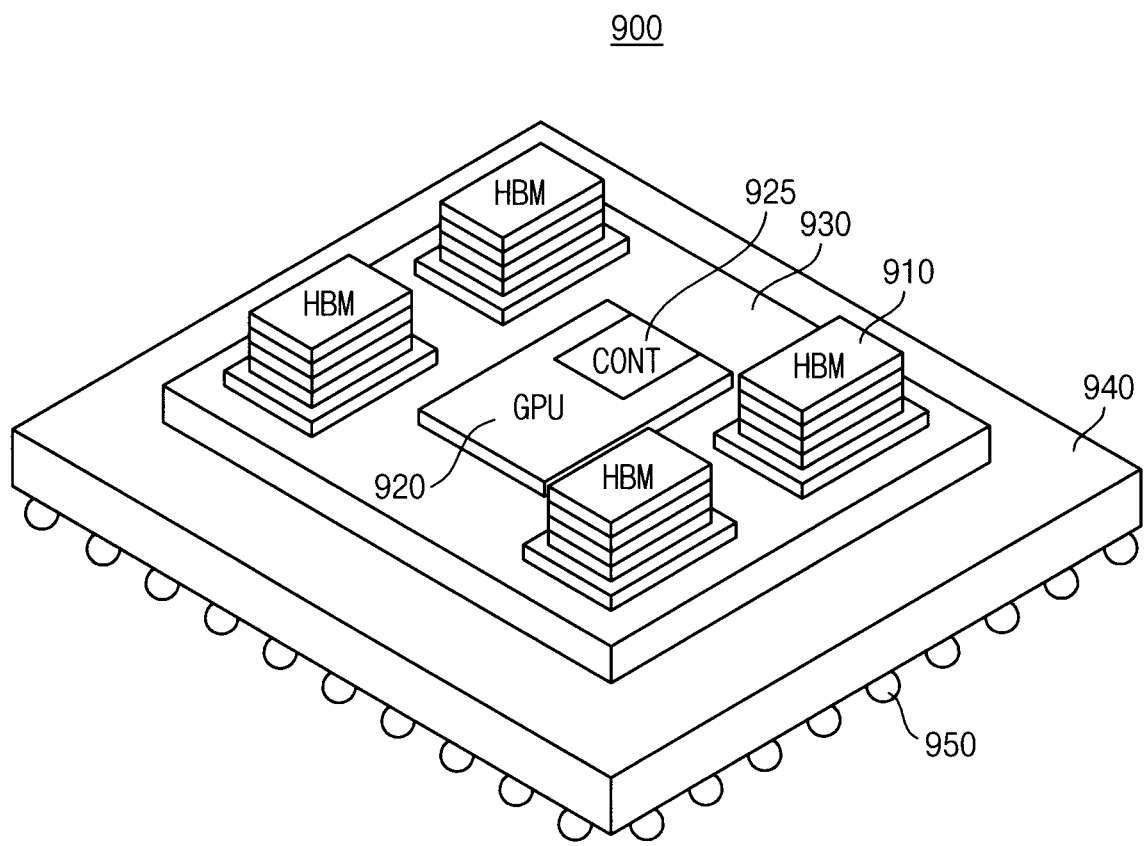
FIG. 25 is a diagram illustrating a semiconductor package including the stacked memory device, according to example embodiments of the present disclosure.

FIG. 25 is a diagram illustrating a semiconductor package including the stacked memory device, according to example embodiments of the present disclosure. Referring to FIG. 25, a semiconductor package 900 may include one or more stacked memory devices 910 and a graphic processing unit (GPU) 920 and the GPU 920 includes a memory controller 925. The stacked memory devices 910 and the GPU 920 may be mounted on an interposer 930, and the interposer on which the stacked memory devices 910 and the GPU 920 are mounted may be mounted on a package substrate 940. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies, and each of the plurality of memory dies may include a memory cell array and an error correction circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, according to example embodiments, the ECC includes a plurality of column vectors corresponding to data bits and a parity data, the column vectors are divided into a plurality of code groups and the column vectors have elements to restrict a location of a sub data unit in which a mis-corrected bit generated by multiple error bits occurs. Therefore, although the main data includes multiple error bits which the error correction circuit cannot correct and/or detect, the error correction circuit in the memory controller may correct the multiple error bits and the mis-corrected bit in a sub data unit. Therefore, the semiconductor memory device and the memory system may enhance performance and credibility of error correction.

Example embodiments of the present disclosure may be applied to semiconductor memory devices and memory systems employing the ECC described herein. While the present disclosure has been particularly shown and described with reference to the example embodiments thereof, it will be understood by those of ordinary skill in the art that various changes in form and detail may be made therein without departing from the spirit and scope of the present disclosure as defined by the following claims.

What is claimed is:

1. A semiconductor memory device, comprising:
a memory cell array having a plurality of volatile memory cells therein, the memory cell array connected to wordlines and bit-lines and divided into a plurality of sub array blocks;
an error correction circuit configured to generate parity data from main data using an error correction code (ECC) represented by a generation matrix;
an input/output (I/O) gating circuit connected between the memory cell array and the error correction circuit; and
a control logic circuit configured to control the error correction circuit and the I/O gating circuit responsive to a command and address received from an external memory controller, the control logic circuit configured to: (i) store the main data and the parity data in (k+1) target sub array blocks among the sub array blocks, and (ii) control the I/O gating circuit such that each of at least two target sub array blocks of the (k+1) target sub array blocks store both a portion of the main data and a portion of the parity data, where k is an even integer greater than two.

2. The semiconductor memory device of claim 1, wherein the main data includes a plurality of data bits arranged into a plurality of sub data units; wherein the ECC includes a plurality of column vectors divided into a plurality of code groups corresponding to the sub data units and the parity data; and wherein the column vectors have elements to restrict a location of a sub data unit in which a mis-corrected bit occurs in response to a generation of multiple error bits of the main data that are uncorrectable by the ECC.

3. The semiconductor memory device of claim 2, wherein the (k+1) target sub array blocks include a first set of sub array blocks configured to store some of the data bits of the main data, and a second set of sub array blocks configured to store both a portion of the data bits of the main data and the portion of the parity data;

wherein the plurality of code groups include a first set of code groups corresponding to the first set of sub array blocks, and a first set of code groups corresponding to the second set of sub array blocks; and wherein the multiple error bits include a first error bit, a second error bit and a third error bit.

4. The semiconductor memory device of claim 3, wherein each of the first set of code groups include first column vectors; and wherein each of the first column vectors includes the same elements with respect to each other.

5. The semiconductor memory device of claim 3,
wherein the multiple error bits include a first error bit and a second error bit;
wherein when a first sub data unit among the plurality of sub data units is stored in a first sub array block among the first set of sub array blocks and the first error bit and the second error bit are included in the first sub data unit, then the column vectors of a code group corresponding to the first sub array block, among the first set of code groups elements, are configured to place the mis-corrected bit in the first sub data unit; and
wherein the external memory controller is configured to correct the first error bit, the second error bit and the mis-corrected bit in the first sub data unit.

6. The semiconductor memory device of claim 3,
wherein the multiple error bits include a first error bit and a second error bit; and
wherein, when a sub data unit among the plurality of sub data units is stored in a sub array block among the second set of sub array blocks and the first error bit and the second error bit are included in the sub data unit, the column vectors have elements to restrict a location of the sub data unit in which the mis-corrected bit occurs, which is generated by the first error bit and the second error bit, such that the mis-corrected bit is correctable by the external memory controller.

7. The semiconductor memory device of claim 1, wherein the control logic circuit is configured to control the I/O gating circuit such that the I/O gating circuit stores parity bits of the parity data in a k/2_th sub array block, a (k/2+1)_th sub array block and a (k/2+3)_th sub array block among the (k+1) target sub array blocks.

8. The semiconductor memory device of claim 1, wherein the error correction circuit includes:
a memory configured to store the ECC;
an ECC encoder connected to the memory, the ECC encoder configured to perform an ECC encoding operation on the main data using the ECC to generate the parity data in a write operation of the semiconductor memory device; and
an ECC decoder connected to the memory, the ECC decoder configured to perform an ECC decoding operation on the main data based on the parity data using the ECC in a read operation of the semiconductor memory device.

9. The semiconductor memory device of claim 1, further comprising:
at least one buffer die; and
a plurality of memory dies stacked on the at least one buffer die and conveying data through a plurality of through silicon via (TSV) lines; and
wherein at least one of the plurality of memory dies includes the memory cell array and the error correction circuit.

10. The semiconductor memory device of claim 9, wherein the at least one buffer die includes a via error correction circuit configured to correct transmission error included in data transmitted through the TSV lines.

11. A semiconductor memory device, comprising:
a memory cell array having a plurality of volatile memory bank arrays therein, which are connected to a plurality of word-lines and a plurality of bit-lines;
an error correction circuit configured to generate parity data based on main data using an error correction code (ECC) represented by a generation matrix, the error correction circuit configured to: (i) store the main data and the parity data in a target area of a target page in the memory cell array, which is designated by an address, (ii) interleave the main data and the parity data such that parity bits of the parity data are stored symmetrically with respect to a virtual center line in the target area, and (iii) vary sub data patterns based on a least significant bit (LSB) of the address designating the target page, the main data and the parity data stored in the target area constituting the sub data patterns;
an input/output (I/O) gating circuit connected between the memory cell array and the error correction circuit; and
a control logic circuit configured to control the error correction circuit based on a command and an address received from an external memory controller.

12. The semiconductor memory device of claim 11,
wherein the main data includes a plurality of data bits and the parity data includes a plurality of parity bits;
wherein the ECC includes a plurality of column vectors corresponding to the data bits and the parity bits; and
wherein the column vectors have elements to restrict a location of a sub data pattern in which a mis-corrected bit occurs, which is generated by error bits of the main data and the error bits that are uncorrectable by the ECC.

13. The semiconductor memory device of claim 12, wherein when a first sub data pattern among the sub data patterns includes the error bits, the column vectors have elements to place the mis-corrected bit in the first sub data pattern or one of other sub data patterns among the sub data patterns except the first sub data pattern.

14. The semiconductor memory device of claim 12, wherein when a first sub data pattern among the sub data patterns includes the error bits, the column vectors have elements to restrict a location of the sub data unit in which the mis-corrected bit occurs, which is generated by the error bits such that the mis-corrected bit is correctable by the external memory controller.

15. The semiconductor memory device of claim 11, wherein when a LSB of the address indicates that the target page corresponds to an even page, the error correction circuit is configured to interleave the parity data such that a sequence of parity bits of the parity data is maintained.

16. The semiconductor memory device of claim 15, wherein when the LSB of the address indicates that the target page corresponds to an odd page, the error correction circuit is configured to interleave the parity data such that a sequence of parity bits of the parity data is reversed.

17. A memory system, comprising:
a semiconductor memory device; and
a memory controller configured to control the semiconductor memory device;
wherein the semiconductor memory device includes:
a memory cell array including a plurality of volatile memory cells, which are connected to word-lines and bit-lines and are divided into a plurality of sub array blocks arranged in a first direction and a second direction crossing the first direction;

a first error correction circuit configured to generate parity data based on main data using a first error correction code (ECC) represented by a first generation matrix;

an input/output (I/O) gating circuit connected between the memory cell array and the first error correction circuit; and a control logic circuit configured to control the first error correction circuit and the I/O gating circuit based on a command and address from the memory controller; and wherein the control logic circuit is configured to: (i) store the main data and the parity data in (k+1) target sub array blocks in the second direction among the sub array blocks, and (ii) control the I/O gating circuit such that each of at least two target sub array blocks of the (k+1) target sub array blocks store both a portion of the main data and a portion of the parity data, and where k is an even integer greater than two.

18. The memory system of claim 17, wherein the main data includes a plurality of data bits divided into a plurality of sub data units;

wherein the first ECC includes a plurality of column vectors divided into a plurality of code groups corresponding to the sub data units and the parity data, and wherein the column vectors have elements to restrict a location of a sub data unit in which a mis-corrected bit occurs, which is generated by multiple error bits of the main data and the multiple error bits that are uncorrectable by the first ECC.

19. The memory system of claim 18, wherein the memory controller includes a second error correction circuit configured to correct error bits in the main data received from the semiconductor memory device, using a second ECC represented by a second generation matrix;

wherein the (k+1) target sub array blocks include:
    a first set of sub array blocks configured to store some of the data bits of the main data; and
    a second set of sub array blocks configured to store both a portion of the data bits of the main data and the portion of the parity data;

wherein the plurality of code groups include a first set of code groups corresponding to the first set of sub array blocks, and a first set of code groups corresponding to the second set of sub array blocks;

wherein the multiple error bits include a first error bit and a second error bit;

wherein when a first sub data unit among the plurality of sub data units is stored in a first sub array block among the first set of sub array blocks and the first error bit and the second error bit are included in the first sub data unit, column vectors of a code group corresponding to the first sub array block, among the first set of code groups, have elements configured to place the mis-corrected bit in the first sub data unit; and wherein the second error correction circuit is configured to correct the multiple error bits and the mis-corrected bit using the second ECC.

20. The memory system of claim 18, wherein the memory controller includes a second error correction circuit configured to correct error bits in the main data received from the semiconductor memory device, using a second ECC represented by a second generation matrix;

wherein the (k+1) target sub array blocks include:
    a first set of sub array blocks configured to store some of the data bits of the main data; and
    a second set of sub array blocks configured to store both of a portion of the data bits of the main data and the portion of the parity data;

wherein the plurality of code groups include:
    a first set of code groups corresponding to the first set of sub array blocks; and
    a second set of code groups corresponding to the second set of sub array blocks;

wherein the multiple error bits include a first error bit and a second error bit;

wherein, when a sub data unit among the plurality of sub data units is stored in a sub array block among the second set of sub array blocks and the first error bit and the second error bit are included in the sub data unit, the column vectors have elements to restrict a location of the sub data unit in which the mis-corrected bit occurs, which is generated by the first error bit and the second error bit, such that the mis-corrected bit is correctable by the memory controller; and wherein the second error correction circuit is configured to correct the multiple error bits and the mis-corrected bit using the second ECC.

* * * * *